(12) United States Patent
Sugiyama

(10) Patent No.: US 10,462,390 B2
(45) Date of Patent: Oct. 29, 2019

(54) IMAGE PICKUP APPARATUS, IMAGE PICKUP METHOD, PROGRAM, AND IMAGE PROCESSING APPARATUS

(71) Applicant: SONY CORPORATION, Tokyo (JP)

(72) Inventor: Toshinobu Sugiyama, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 232 days.

(21) Appl. No.: 15/520,613

(22) PCT Filed: Nov. 26, 2015

(86) PCT No.: PCT/JP2015/083242
§ 371 (c)(1),
(2) Date: Apr. 20, 2017

(87) PCT Pub. No.: WO2016/093070
PCT Pub. Date: Jun. 16, 2016

(65) Prior Publication Data
US 2017/0318238 A1    Nov. 2, 2017

(30) Foreign Application Priority Data

Dec. 10, 2014    (JP) .................................. 2014-250165

(51) Int. Cl.
*H04N 5/33* (2006.01)
*H04N 5/351* (2011.01)
(Continued)

(52) U.S. Cl.
CPC ....... *H04N 5/332* (2013.01); *H01L 27/14621* (2013.01); *H01L 27/14649* (2013.01);
(Continued)

(58) Field of Classification Search
CPC ...... H04N 5/332; H04N 5/351; H04N 5/2256; H04N 5/374; H04N 5/378; H04N 9/045;
(Continued)

(56) References Cited

U.S. PATENT DOCUMENTS

| | | | | |
|---|---|---|---|---|
| 2011/0063451 A1* | 3/2011 | Kamon | ................ | H04N 5/2353 348/164 |
| 2012/0075534 A1* | 3/2012 | Katz | .................... | H04N 9/3182 348/602 |
| 2013/0002882 A1* | 1/2013 | Onozawa | ............. | H04N 5/2353 348/164 |

FOREIGN PATENT DOCUMENTS

| | | |
|---|---|---|
| JP | 2001-36916 A | 2/2001 |
| JP | 2005-45559 A | 2/2005 |

(Continued)

OTHER PUBLICATIONS

International Search Report dated Feb. 16, 2016 in PCT/JP2015/083242 filed Nov. 26, 2015.

*Primary Examiner* — Maria E Vazquez Colon
(74) *Attorney, Agent, or Firm* — Oblon, McClelland, Maier & Neustadt, L.L.P.

(57) ABSTRACT

The present disclosure relates to an image pickup apparatus, an image pickup method, a program, and an image processing apparatus that enable a color image to be generated on the basis of an infrared image and a visible image captured using an image pickup device that uses a focal plane reading system.
An image pickup apparatus according to the present disclosure includes: an image pickup device that generates, in a one frame period, sub-frame images in a number corresponding to 3 or more sub-frame periods; an infrared light irradiation unit that turns on/off irradiation of infrared light onto an image pickup range in a time length unit that is the same as the sub-frame period in the one frame period; and a color image generation unit that generates a color image in a predetermined frame rate on the basis of an infrared image based on the sub-frame image in which a period during which the infrared light is irradiated is included in an exposure time and a visible image based on the sub-frame (Continued)

image in which the period during which the infrared light is irradiated is not included in the exposure time. The present disclosure is applicable to a surveillance camera, for example.

16 Claims, 16 Drawing Sheets

(51) Int. Cl.
  *H01L 27/146* (2006.01)
  *H04N 5/374* (2011.01)
  *H04N 5/378* (2011.01)
  *H04N 9/04* (2006.01)
  *H04N 5/225* (2006.01)

(52) U.S. Cl.
  CPC ........... *H04N 5/2256* (2013.01); *H04N 5/351* (2013.01); *H04N 5/374* (2013.01); *H04N 5/378* (2013.01); *H04N 9/045* (2013.01); *G06T 2207/10024* (2013.01)

(58) Field of Classification Search
  CPC ......... H01L 27/14621; H01L 27/14649; G06T 2207/10024
  See application file for complete search history.

(56) References Cited

FOREIGN PATENT DOCUMENTS

| JP | 2005-130317 A | 5/2005 |
| JP | 2010-161455 | 7/2010 |
| JP | 2011-50049 A | 3/2011 |
| JP | 2011-233983 A | 11/2011 |

\* cited by examiner

IMAGE PICKUP APPARATUS, IMAGE PICKUP METHOD, PROGRAM, AND IMAGE PROCESSING APPARATUS

TECHNICAL FIELD

The present disclosure relates to an image pickup apparatus, an image pickup method, a program, and an image processing apparatus, more particularly, to an image pickup apparatus, an image pickup method, a program, and an image processing apparatus that enable a color image to be generated on the basis of an infrared image captured by irradiating infrared light.

BACKGROUND ART

From the past, there are surveillance cameras that include a day mode in which images are captured under natural daylight or under lightings of visible light such as white light and a night mode in which images are captured by irradiating infrared light.

In the day mode, color images can be captured. On the other hand, in the night mode, reflected light of irradiated infrared light, that has been reflected by a subject, is received, so color information of R, B, G, and the like cannot be obtained, and only a light reception intensity of the reflected light (infrared light) can be obtained. Therefore, the obtained image becomes a monochrome image including gray, green, and the like.

Incidentally, when considering usages of surveillance cameras, it is desirable for color images to be obtained even in the night mode.

In this regard, various methods for generating a color image on the basis of an image obtained by capturing a state where infrared light is irradiated onto an image pickup range (subject) (hereinafter, referred to as infrared image) have been proposed from the past.

For example, Patent Literature 1 discloses a method of generating a color image on the basis of an infrared image obtained by irradiating 3 types of infrared light having different wavelengths. This method uses the fact that a reflectance in a case where infrared light having wavelengths of 780 nm, 870 nm, and 940 nm are irradiated onto a resin and a reflectance in a case where visible light of R, G, and B are irradiated have a positive correlation. By this method, as long as the subject is a resin, a color image having high color reproducibility can be obtained.

However, in a case where the subject is other than a resin, while reproducibility of R components of a color image to be generated is relatively high, G and B components cannot be reproduced in their original colors, so this method is inapplicable to arbitrary subjects other than a resin.

Further, for example, Patent Literature 2 discloses a method of capturing an image by irradiating infrared light in a state where a subject is barely visible under a low-illuminance lighting or the like. In this method, an image in which visible light and infrared light are mixed is captured, and color information is reproduced as parameters of white balance processing applied to this image are changed from values applied to a normal image that uses only visible light.

In this method, however, there is an essential problem that infrared light and visible light cannot be separated from each other, so accuracy of color information to be reproduced is deteriorated due to an influence of infrared light.

Furthermore, for example, Patent Literature 3 and Non-Patent Literature 1 disclose technologies for consecutively capturing an infrared image in a state where infrared light is irradiated and a visible image under low illuminance where infrared light is not irradiated and generating a color image using those images.

CITATION LIST

Patent Literature

Patent Literature 1: Japanese Patent Application Laid-open No. 2011-50049
Patent Literature 2: Japanese Patent Application Laid-open No. 2005-130317
Patent Literature 3: Japanese Patent Application Laid-open No. 2011-233983

Non-Patent Literature

Non-Patent Literature 1: "Color image generation in low-illuminance scene using infrared flash and one camera" Meeting on Image Recognition and Understanding (MIRU2011) P1034.

DISCLOSURE OF INVENTION

Technical Problem

Incidentally, a CCD or CMOS image sensor is generally used as an image pickup device mounted on an image pickup apparatus including a surveillance camera and the like. CCD includes a global shutter function that simultaneously exposes all pixels in terms of a structure thereof. In contrast, there are CMOS image sensors that do not include a global shutter function (provided that there are CMOS image sensors that include global shutter function) and adopt a rolling shutter system in which a pixel exposure time is shifted in a line unit, in terms of a structure thereof. It should be noted that the rolling shutter system is also called focal plane reading system.

In a case where an infrared image and a visible image are consecutively captured as in the technology disclosed in Patent Literature 3 using a CMOS image sensor that uses the focal plane reading system, an infrared image in which an infrared light irradiation time is equal across an entire screen (all pixels) cannot always be obtained due to the deviation of the pixel exposure time in a line unit, and a color image having high color reproducibility cannot be generated when using such an infrared image.

In other words, for capturing an infrared image in which an infrared light irradiation time is equal across an entire screen and a visible image that is not influenced by infrared light at all using the CMOS image sensor that uses the focal plane reading system, some kind of ingenuity is necessary regarding an infrared light irradiation timing and an exposure timing.

The present disclosure has been made in view of the circumstances as described above and aims at enabling a color image to be generated on the basis of an infrared image and visible image captured using an image pickup device that uses the focal plane reading system.

Solution to Problem

An image pickup apparatus according to a first aspect of the present disclosure includes: an image pickup device that divides one frame period corresponding to a predetermined frame rate into 3 or more sub-frame periods and sweeps pixel values of an entire screen for each of the sub-frame periods using a focal plane reading system to generate, in the one frame period, sub-frame images in a number corresponding to the number of sub-frame periods; an infrared light irradiation unit that turns on/off irradiation of infrared light onto an image pickup range in a time length unit that is the same as the sub-frame period in the one frame period; and a color image generation unit that generates a color image at the predetermined frame rate on the basis of an infrared image based on the sub-frame image in which a period during which the infrared light is irradiated is included in an exposure time and a visible image based on the sub-frame image in which the period during which the infrared light is irradiated is not included in the exposure time.

The color image generation unit may include an infrared image generation unit that generates an infrared image from the plurality of sub-frame images in which the period during which the infrared light is irradiated is included in the exposure time.

The infrared image generation unit may generate the infrared image from the plurality of sub-frame images whose luminance gradations are in a complementary relationship, the plurality of sub-frame images having the period during which the infrared light is irradiated included in the exposure time.

The color image generation unit may further include a visible image generation unit that generates the visible image from the plurality of sub-frame images in which the period during which the infrared light is irradiated is not included in the exposure time.

The color image generation unit may further include an infrared image conversion unit that extracts luminance information from the infrared image, a visible image conversion unit that extracts color difference information from the visible image, and a color image conversion unit that converts the luminance information of the infrared image and the color difference information of the visible image into color information of the color image.

The visible image conversion unit may also extract luminance information from the visible image, and the color image conversion unit may convert the luminance information of the infrared image and the color difference information of the visible image into the color information of the color image, the luminance information and the color difference information having been corrected using the luminance information of the visible image.

The color image generation unit may further include a first 3DNR unit that carries out 3DNR processing including time direction processing on the infrared image, and a second 3DNR unit that carries out the 3DNR processing including the time direction processing on the visible image, and a feedback ratio of the time direction processing in the first 3DNR unit and a feedback ratio of the time direction processing in the second 3DNR unit may differ.

The second 3DNR unit may carry out the 3DNR processing on the visible image using a moving subject detection result supplied from the first 3DNR unit.

The color image generation unit may further include a 2DNR unit that carries out 2DNR processing on the visible image using an edge detection result supplied from the first 3DNR unit.

A light reception surface of the image pickup device may be covered by a color filter in a Bayer array, an RGB-IR filter, or an RGB-W filter.

The image pickup device may include an electronic shutter function, and the exposure time during image pickup of the sub-frame images that are to become a base of the infrared image may differ in a time length from the exposure time during image pickup of the sub-frame images that are to become a base of the visible image.

The image pickup device may include an amplification unit that amplifies pixel signals and an electronic shutter function, and a gain of the amplification unit may differ between the time of image pickup of the sub-frame images that are to become a base of the infrared image and the time of image pickup of the sub-frame images that are to become a base of the visible image.

An image pickup method according to a first aspect of the present disclosure is an image pickup method for an image pickup apparatus including an image pickup device, an infrared light irradiation unit, and a color image generation unit, the method including the steps of: dividing, by the image pickup device, one frame period corresponding to a predetermined frame rate into 3 or more sub-frame periods and sweeping pixel values of an entire screen for each of the sub-frame periods using a focal plane reading system to generate, in the one frame period, sub-frame images in a number corresponding to the number of sub-frame periods; turning on/off, by the infrared light irradiation unit, irradiation of infrared light onto an image pickup range in a time length unit that is the same as the sub-frame period in the one frame period; and generating, by the color image generation unit, a color image at the predetermined frame rate on the basis of an infrared image based on the sub-frame image in which a period during which the infrared light is irradiated is included in an exposure time and a visible image based on the sub-frame image in which the period during which the infrared light is irradiated is not included in the exposure time.

A program according to a first aspect of the present disclosure is a program for controlling a computer of an image pickup apparatus including an image pickup device and an infrared light irradiation unit to execute processing including the steps of: dividing, by the image pickup device, one frame period corresponding to a predetermined frame rate into 3 or more sub-frame periods and sweeping pixel values of an entire screen for each of the sub-frame periods using a focal plane reading system to generate, in the one frame period, sub-frame images in a number corresponding to the number of sub-frame periods; turning on/off, by the infrared light irradiation unit, irradiation of infrared light onto an image pickup range in a time length unit that is the same as the sub-frame period in the one frame period; and generating a color image at the predetermined frame rate on the basis of an infrared image based on the sub-frame image in which a period during which the infrared light is irradiated is included in an exposure time and a visible image based on the sub-frame image in which the period during which the infrared light is irradiated is not included in the exposure time.

In the first aspect of the present disclosure, the image pickup device divides one frame period corresponding to a predetermined frame rate into 3 or more sub-frame periods and sweeps pixel values of an entire screen for each of the sub-frame periods using a focal plane reading system to generate, in the one frame period, sub-frame images in a number corresponding to the number of sub-frame periods, the infrared light irradiation unit turns on/off irradiation of infrared light onto an image pickup range in a time length unit that is the same as the sub-frame period in the one frame period, and the color image generation unit generates a color image at the predetermined frame rate on the basis of an infrared image based on the sub-frame image in which a period during which the infrared light is irradiated is included in an exposure time and a visible image based on the sub-frame image in which the period during which the infrared light is irradiated is not included in the exposure time.

An image processing apparatus according to a second aspect of the present disclosure is an image processing apparatus that receives, from an image pickup apparatus including an image pickup device that divides one frame period corresponding to a predetermined frame rate into 3 or more sub-frame periods and sweeps pixel values of an entire screen for each of the sub-frame periods using a focal plane reading system to generate, in the one frame period, sub-frame images in a number corresponding to the number of sub-frame periods, and an infrared light irradiation unit that turns on/off irradiation of infrared light onto an image pickup range in a time length unit that is the same as the sub-frame period in the one frame period, an input of the sub-frame images captured by the image pickup apparatus, the image processing apparatus including a color image generation unit that generates a color image at the predetermined frame rate on the basis of an infrared image based on the sub-frame image in which a period during which the infrared light is irradiated is included in an exposure time and a visible image based on the sub-frame image in which the period during which the infrared light is irradiated is not included in the exposure time.

In the second aspect of the present disclosure, a color image is generated at the predetermined frame rate on the basis of the infrared image based on the sub-frame image in which the period during which the infrared light is irradiated is included in the exposure time and the visible image based on the sub-frame image in which the period during which the infrared light is irradiated is not included in the exposure time.

Advantageous Effects of Invention

According to the first and second aspects of the present disclosure, a color image having high color reproducibility can be generated.

MODE FOR CARRYING OUT THE INVENTION

Hereinafter, a best mode for carrying out the present disclosure (hereinafter, referred to as embodiment) will be specifically described with reference to the drawings.

Figure 1:
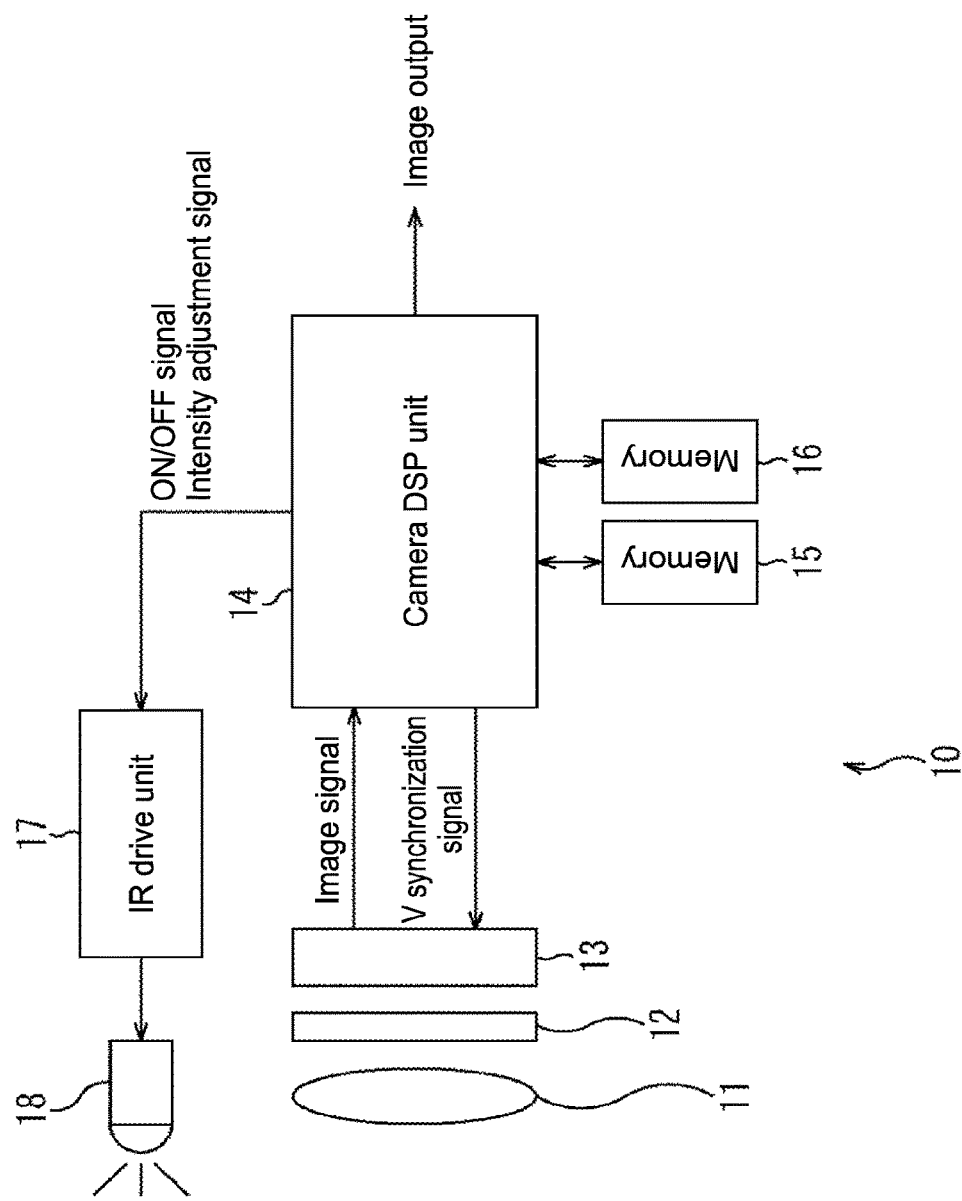
FIG. 1 A block diagram showing a configuration example of an image pickup apparatus to which the present disclosure is applied.

Configuration Example of Image Pickup Apparatus According to Embodiment of Present Disclosure FIG. 1 shows a configuration example of an image pickup apparatus according to an embodiment of the present disclosure.

An image pickup apparatus 10 is used in a surveillance camera or the like, for example, and generates a color image on the basis of an infrared image obtained by irradiating infrared light and a visible image obtained under low illuminance where infrared light is not irradiated.

The image pickup apparatus 10 is configured by an image pickup system having a configuration similar to that of a general camera, an image processing system that carries out image processing, and a projection system that irradiates infrared light toward an image pickup range.

The image pickup system of the image pickup apparatus 10 is constituted of a lens 11, an IR bandpass filter 12, and a CMOS image sensor (hereinafter, abbreviated as CMOS) 13 that uses a focal plane reading system (rolling shutter system). In the image pickup system, the lens 11 collects an optical image of a subject in the CMOS 13, the IR bandpass filter 12 arranged between the lens 11 and the CMOS 13 extracts visible light components and infrared light components from the optical image of the subject, and the CMOS 13 generates image signals based on incident light and outputs the signals to the image processing system.

Figure 2:
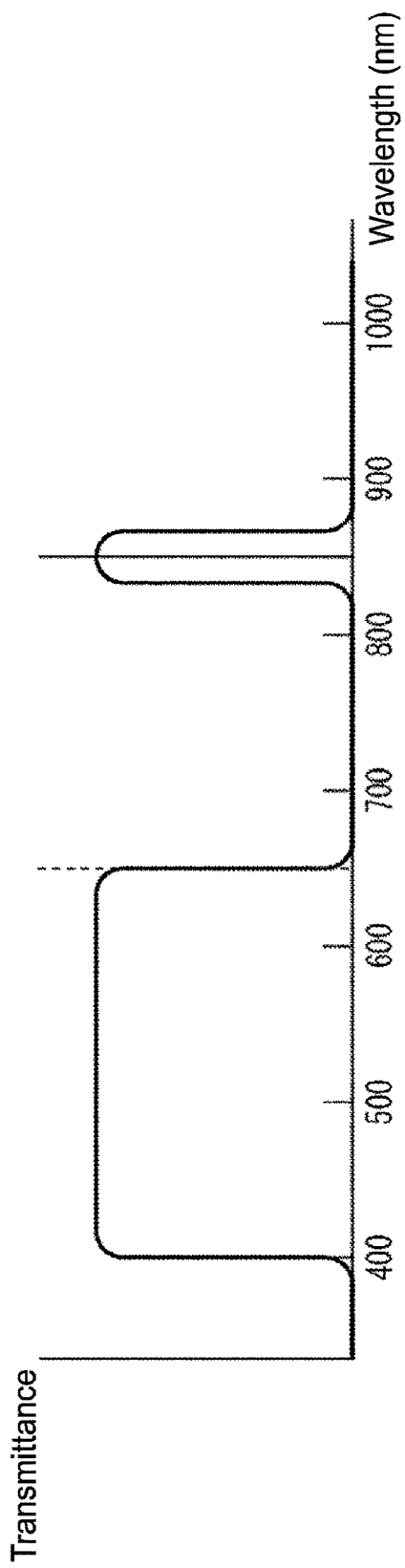
FIG. 2 A diagram showing a transmission property of an IR bandpass filter.

FIG. 2 shows a transmission property of the IR bandpass filter 12. The IR bandpass filter 12 has a high transmittance with respect to visible light having a wavelength of 400 nm to 650 nm and infrared light (infrared light irradiated by projection system) having a peak at a wavelength of 850 nm.

Figure 3:
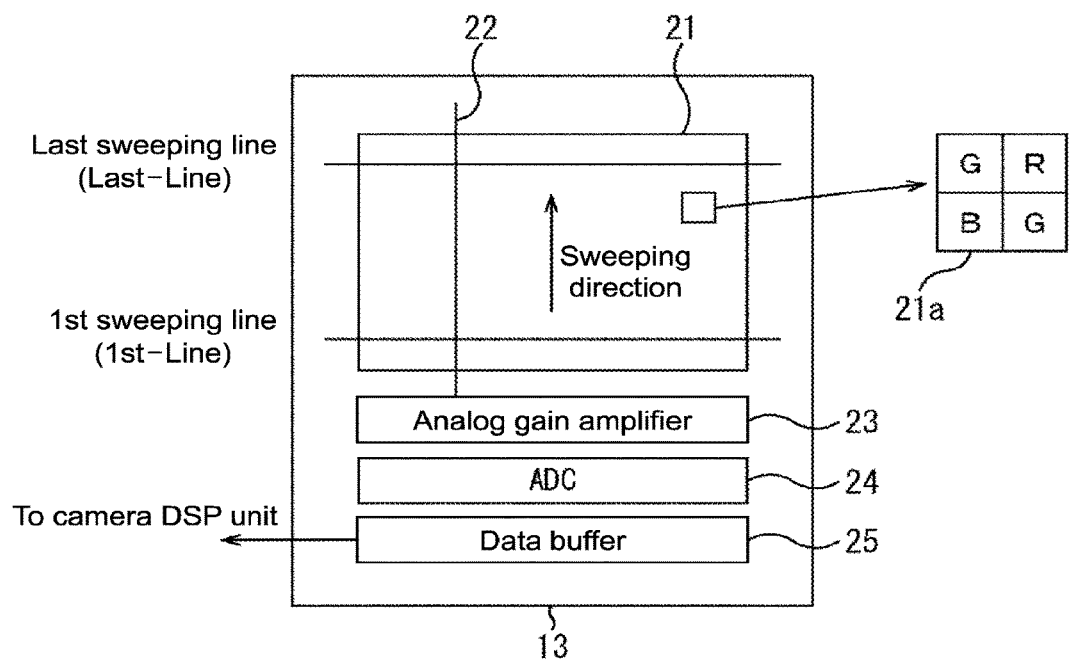
FIG. 3 A block diagram showing a configuration example of a CMOS image sensor.

FIG. 3 shows a configuration example of the CMOS 13. The CMOS 13 includes a sensor array 21, a signal line 22, an analog gain amplifier 23, an ADC 24, and a data buffer 25. The sensor array 21 is constituted of photoelectric conversion devices that are respectively provided for each pixel and arranged longitudinally and laterally, and a light reception surface side thereof is covered by a color filter 21a in a Bayer array or the like.

Figure 4:
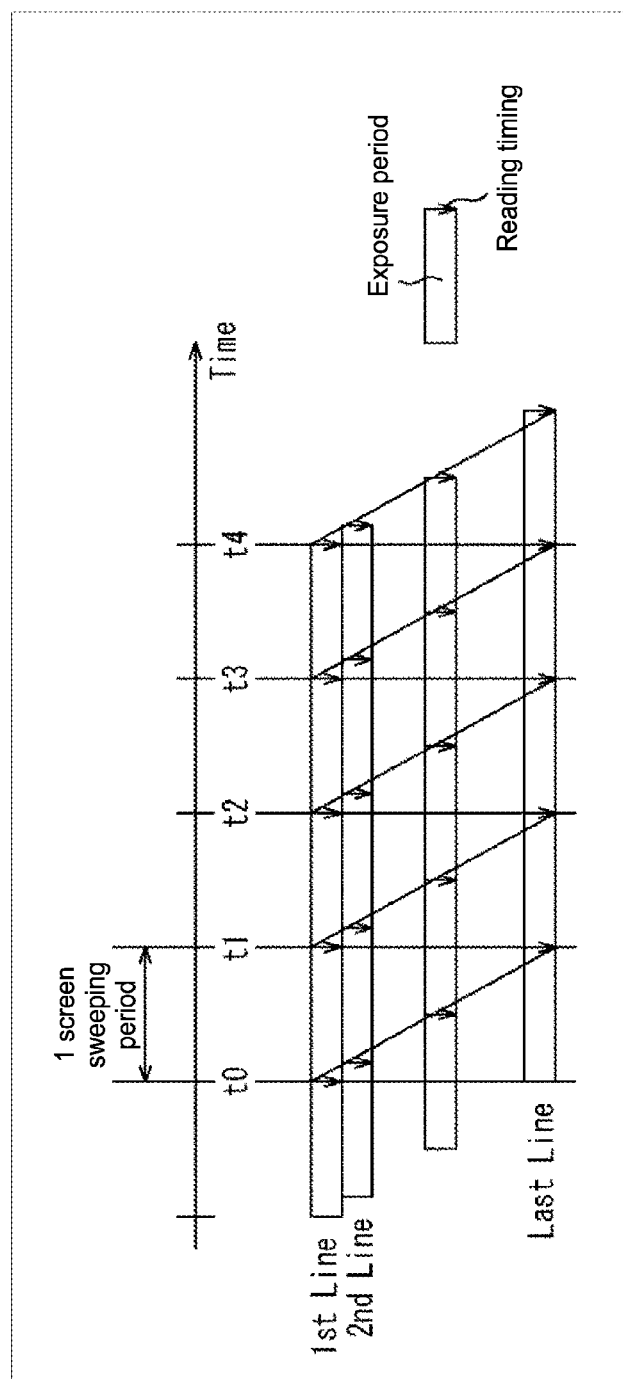
FIG. 4 A block diagram showing a first configuration example of a camera DSP unit.

FIG. 4 shows an exposure for respective pixel times in the sensor array 21 of the CMOS 13 and reading timings of charge signals obtained by the exposure. As shown in the figure, in the CMOS 13, an exposure period is shifted in a line unit in a sweeping direction from a first sweeping line (1st-Line) to a last sweeping line (Last-Lien), and at a timing at which the exposure period ends, charge signals obtained during the exposure period are collectively read out for each line.

The readout charge signals are output to the analog gain amplifier 23 via the signal line 22 and amplified, converted into digital pixel signals by the ADC 24, and stored in the data buffer 25. It should be noted that a gain of the analog gain amplifier 23 can be set adaptively according to a lighting. Then, pixel signals of all pixels configuring the sensor array 21 are output as image signals to the subsequent image processing system. It should be noted that the image signals at this stage are RAW data in which the respective pixels include color information of any of R, G, and B.

Referring back to FIG. 1, the image processing system of the image pickup apparatus 10 is constituted of a camera DSP unit 14 and memories 15 and 16. In the image processing system, the camera DSP unit 14 generates a color image whose pixels include color information of R, G, and B on the basis of the image signals from the image pickup system. The memories 15 and 16 temporarily store image signals to be used for NR (noise reduction) processing. In addition, the camera DSP unit 14 generates and outputs V synchronization signals for controlling drive (exposure and reading) of the CMOS 13 of the image pickup system. The camera DSP unit 14 also generates and outputs driver signals (ON/OFF signal and intensity adjustment signal) for controlling the projection system.

The projection system of the image pickup apparatus 10 is constituted of an IR drive unit 17 and an IR irradiation unit 18. In the projection system, the IR drive unit 17 causes the IR irradiation unit 18 to irradiate infrared light under control of the camera DSP unit 14. The IR irradiation unit 18 irradiates infrared light having a peak at a wavelength of 850 nm toward the image pickup range. It should be noted that the IR irradiation unit 18 may be provided inside a casing of the image pickup apparatus 10 or may be provided outside the casing of the image pickup apparatus 10.

First Example of Image Pickup Timing by CMOS 13

Figure 5:
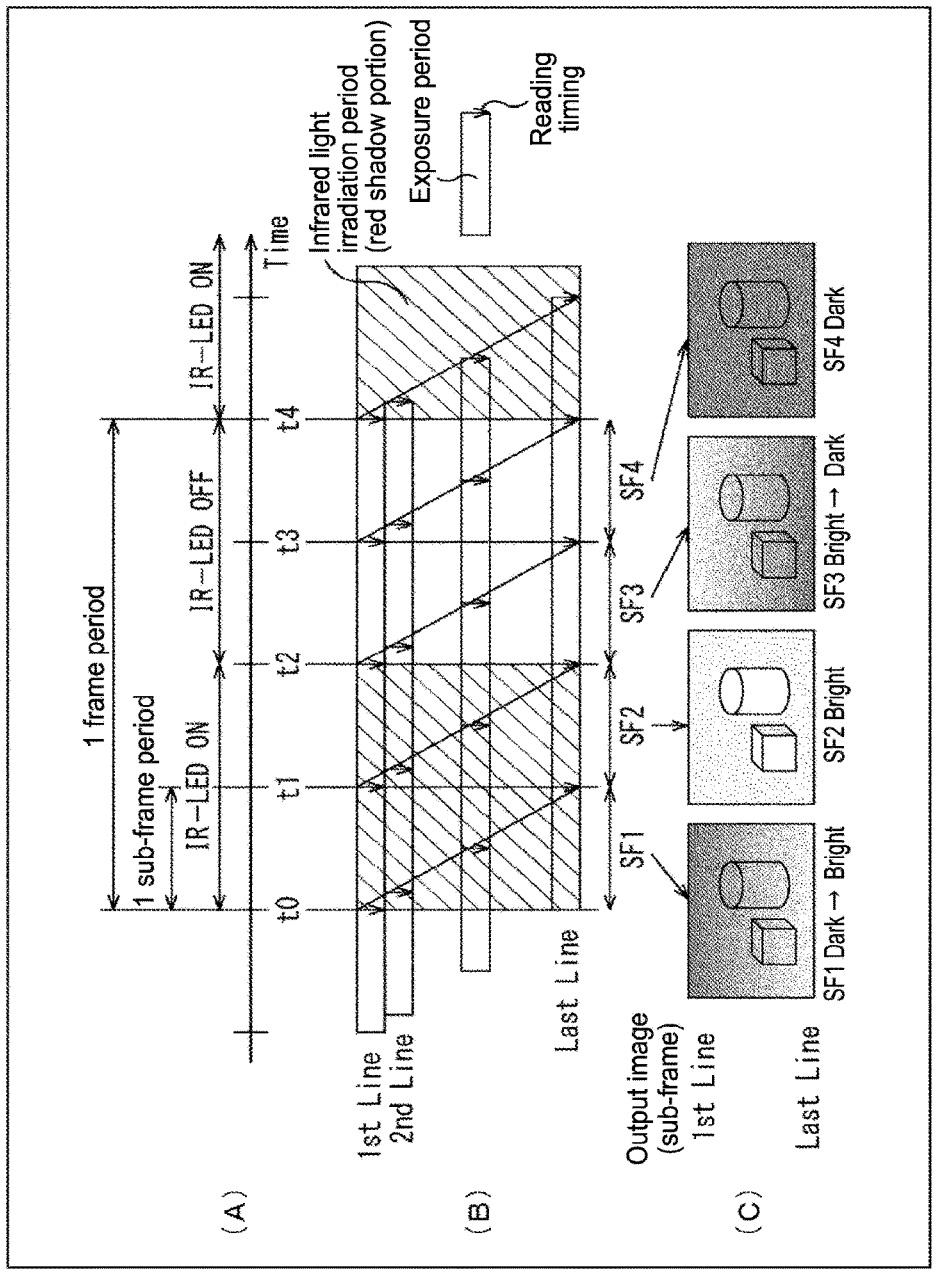
FIG. 5 Diagrams showing a first example of an image pickup timing.

Next, FIG. 5 show a first example of an image pickup timing by the CMOS 13.

In the CMOS 13, one frame period (1/30 sec in a case of 30 fps) of a frame rate of a color image to be eventually output (e.g., 30 fps) is divided into 4 so that, with a sub-frame period (1/120 sec in the case of 30 fps) being a one-screen sweeping period of the CMOS 13, 4 sub-frame images are output from the CMOS 13 during the one frame period.

In capturing 4 sub-frame images during the one frame period, irradiation of infrared light is turned on during two consecutive sub-frame periods, and the irradiation of infrared light is turned off during the other two sub-frame periods. It should be noted that although the irradiation of infrared light is turned on in first and second sub-frame periods (t0 to t2) in the one frame period in the case of FIG. 5, the irradiation of infrared light may be turned on in second and third sub-frame periods (t1 to t3) or third and fourth sub-frame periods (t2 to t4), for example.

Hereinafter, a sub-frame image obtained at the time the first sub-frame period ends will be referred to as sub-frame image SF1. Similarly, sub-frame images obtained at the time the second, third, and fourth sub-frame periods end will respectively be referred to as sub-frame images SF2, SF3, and SF4.

In the sub-frame image SF1 in the first example shown in FIG. 5, lines near the head of sweeping (1st-Line) become dark since a time during which the irradiation of infrared light is turned on within an exposure period is short and gradually become brighter as the sweeping progresses since the time during which the irradiation of infrared light is turned on becomes longer.

Since the irradiation of infrared light is turned on throughout the entire exposure period of all lines in the sub-frame image SF2, the sub-frame image SF2 becomes an image that is equally bright across the entire screen. In addition, since the exposure time is short, an image in which a motion blur of a moving subject is suppressed is obtained. Further, while there is a problem of a longitudinal deviation of a moving subject moving at high speed (due to deviation of exposure period for each line) in the CMOS sensor that uses the focal plane reading system, there is an advantage that no longitudinal deviation is caused in the sub-frame image SF2 (infrared image) since the infrared light irradiation period is the same for all lines.

In the sub-frame image SF3, a light-dark change becomes opposite to that of the sub-frame image SF1, and an image that gradually darkens as the sweeping progresses since the time during which the irradiation of infrared light is turned on becomes shorter is obtained. The sub-frame image SF4 becomes an image that is based only on visible light and with which the entire screen becomes dark since the irradiation of infrared light is turned off throughout the entire exposure period of all lines. Hereinafter, the sub-frame image SF2 will also be referred to as infrared image, and the sub-frame image SF4 will also be referred to as visible image.

In the camera DSP unit 14 to which the 4 sub-frame images SF1 to SF4 are input per frame period, a color image is generated using, out of the 4 sub-frame images, the sub-frame image SF2 (infrared image) and the sub-frame image SF4 (visible image) that have no light-dark gradient.

First Configuration Example of Camera DSP Unit 14

Figure 6:
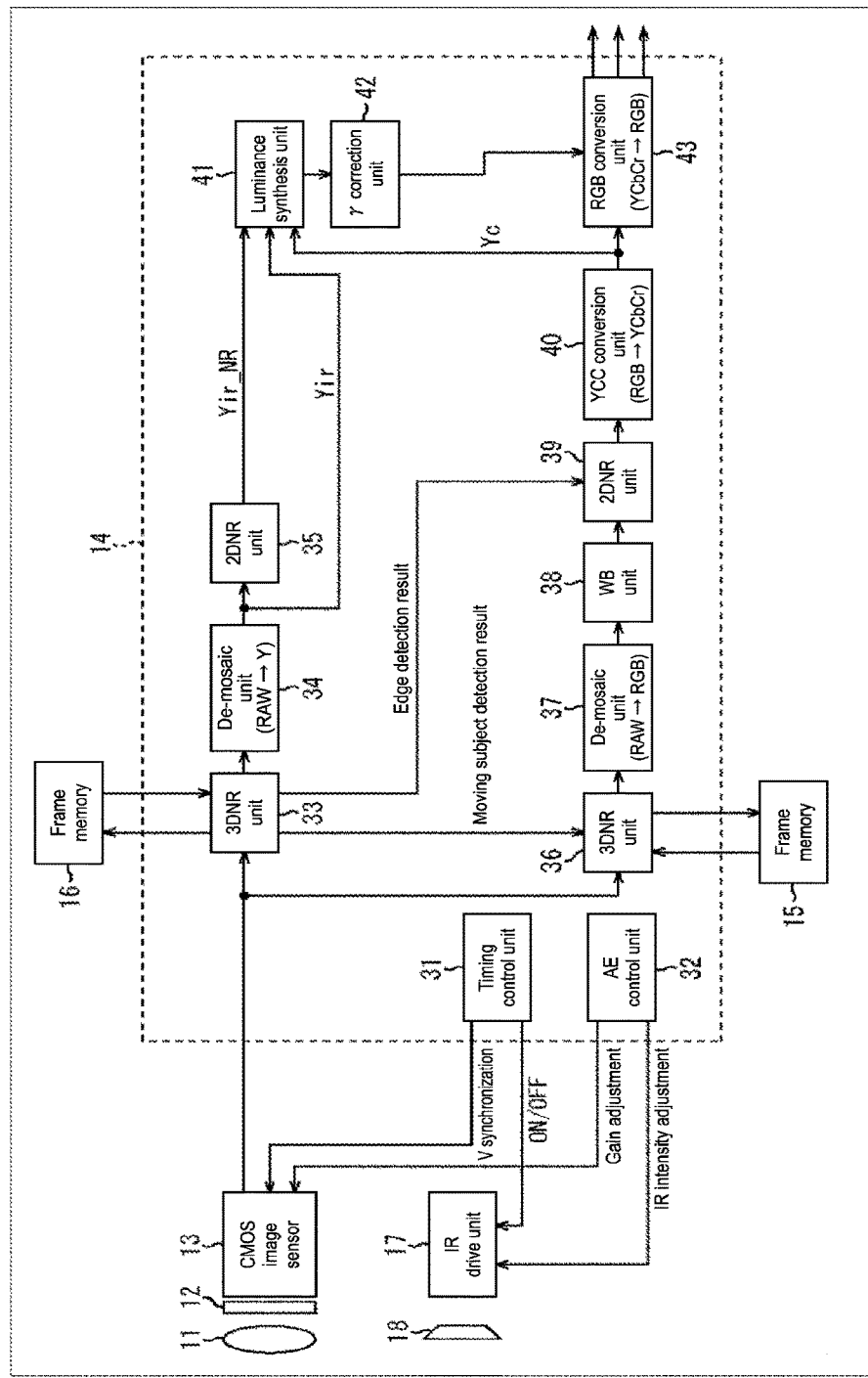
FIG. 6 A block diagram showing a configuration example of the camera DSP unit.

Next, FIG. 6 shows a first configuration example of the camera DSP unit 14, which corresponds to the first example of the image pickup timing shown in FIG. 5. The camera DSP unit 14 includes a timing control unit 31 and an AE control unit 32 and is configured by an infrared image processing system, a visible image processing system, and a color image generation system.

The timing control unit 31 generates V synchronization signals for controlling drive of the CMOS 13 and ON/OFF signals for controlling the IR drive unit 17. The AE control unit 32 generates gain adjustment signals for controlling the analog gain amplifier 23 in the CMOS 13 and intensity signals for controlling the IR drive unit 17.

Of the 4 sub-frame images input per frame period from the CMOS 13, the infrared image processing system of the camera DSP unit 14 targets the infrared image (sub-frame image SF2) as a processing target and is constituted of a 3DNR unit 33, a de-mosaic unit 34, and a 2DNR unit 35.

The 3DNR unit 33 carries out 3DNR processing obtained by combining 2DNR processing of 2-dimensionally removing noises by carrying out filtering processing on pixels of an infrared image (sub-frame image SF2) input from the CMOS 13 and peripheral pixels and time direction processing of carrying out weighted averaging on the infrared image input from the CMOS 13 and a past (before one frame period) infrared image that has been subjected to the 3DNR processing and is stored in the frame memory 16. It should be noted that a weighting value with respect to the current infrared image in the time direction processing is referred to as feedback ratio, and the feedback ratio herein is set to be larger than that of a 3DNR unit 36 to be described later. For example, the feedback ratio of the 3DNR unit 36 is set to be 1/8, and the feedback ratio of the 3DNR unit 33 is set to be 1/2 or the like.

Further, in the time direction processing in the 3DNR processing, a noise reduction effect becomes higher as a feedback ratio of a current image becomes smaller, but since components of a past image are apt to remain, a residual image is caused at edges of a moving subject. In this regard, to avoid such a situation, the 3DNR unit 33 takes measures to detect a moving subject by an inter-sub-frame difference and raise, for the moving subject part of the image, a feedback ratio of a current image, to suppress generation of a residual image. Here, the detected moving subject detection result is notified to the 3DNR unit 36, and an edge detection result is notified to a 2DNR unit 39.

The infrared image subjected to the 3DNR processing by the 3DNR unit 33 is output to the de-mosaic unit 34 and overwritten and recorded in the frame memory 16.

The de-mosaic unit 34 extracts luminance information Yir of the pixels from the infrared image subjected to the 3DNR processing (RAW data) and outputs it to the 2DNR unit 35 and a luminance synthesis unit 41. Specifically, the pixel values of the RAW data become the luminance information Yir as they are, or values obtained by adding pixel values of R, G, and B pixels in the vicinity become the luminance information Yir.

The 2DNR unit 35 extracts low-frequency components by carrying out 2D noise reduction processing on the luminance information Yir of the infrared image and outputs luminance information Yir_NR obtained as a result of the processing to the luminance synthesis unit 41.

Of the 4 sub-frame images input per frame period from the CMOS 13, the visible image processing system of the camera DSP unit 14 targets the visible image (sub-frame image SF4) as a processing target and is constituted of the 3DNR unit 36, a de-mosaic unit 37, a white balance (WB) unit 38, the 2DNR unit 39, and a YCC conversion unit 40.

The 3DNR unit 36 carries out 3DNR processing obtained by combining 2DNR processing of 2-dimensionally removing noises by carrying out filtering processing on pixels of a visible image (sub-frame image SF4) input from the CMOS 13 and peripheral pixels and time direction processing of carrying out weighted averaging on the visible image input from the CMOS 13 and a past (before one frame period) visible image that has been subjected to the 3DNR processing and is stored in the frame memory 15. It should be noted that the visible image input to the 3DNR unit 36 is a low-illuminance image with many noises. Therefore, even when a moving subject is detected from the visible image for the time direction processing, movements and noises cannot be distinguished from one another, and the moving subject cannot be detected appropriately. In this regard, the 3DNR unit 36 carries out the time direction processing using the moving subject detection result detected from the infrared image, the detection result being supplied from the 3DNR unit 33. Moreover, the feedback ratio of the 3DNR unit 36 is set to be 1/8 or the like that is smaller than that of the 3DNR unit 33 (e.g., 1/2). Accordingly, it becomes possible to sufficiently reduce noises while suppressing a residual image of the moving subject in the 3DNR unit 36.

The de-mosaic unit 37 converts the image signals subjected to the 3DNR processing (RAW data) into RGB data in which the pixels respectively include R, G, B color information and outputs the data to the WB unit 38. The WB unit 38 carries out white balance processing on the image signals (RAW data) and outputs them to the 2DNR unit 39.

The 2DNR unit 39 carries out 2D noise reduction processing (2DNR processing) using a wideband filter such as a $\varepsilon$ filter and outputs the result to the YCC conversion unit 40, for example. It should be noted that by detecting edges of a subject and applying the wideband filter to only the inside of the edges in carrying out the 2DNR processing, it becomes possible to avoid different color information outside the edges from being drawn in. However, since the visible image supplied to the 2DNR unit 39 is a low-illuminance image with many noises, edges cannot be detected appropriately. In this regard, the 2DNR unit 39 carries out the 2DNR processing using the edge detection result detected from the infrared image, the edge detection result being supplied from the 3DNR unit 33. Accordingly, it becomes possible to carry out the 2D noise reduction processing using the wideband filter without mixing colors near the edges in the 2DNR unit 39.

The YCC conversion unit 40 converts the visible image subjected to the 2DNR processing (RGB data) into a visible image in which the pixels include luminance information Y and color difference information Cb and Cr (YCC data) and outputs the luminance information Y (hereinafter, referred to as Yc) to the luminance synthesis unit 41 and the color difference information Cb and Cr to an RGB conversion unit 43.

The color image generation system of the camera DSP unit 14 targets outputs of the infrared image processing system and the visible image processing system as processing targets and is constituted of the luminance synthesis unit 41, a $\gamma$ correction unit 42, and the RGB conversion unit 43.

The luminance synthesis unit 41 synthesizes luminance signals of a color image to be generated in a subsequent stage on the basis of the luminance information Yir and luminance information Yir_NR of the infrared image input from the infrared image processing system and the luminance information Yc of the visible image input from the visible image processing system.

It should be noted that in a case where the luminance information Yir of the infrared image does not pass through the luminance synthesis unit 41 and is used as it is as the luminance signal of a color image, color reproducibility of a subject whose reflectance of infrared light and reflectance of visible light largely differ is deteriorated due to a difference in the luminance information. For example, in the case of black clothes having a high infrared reflectance (low visible light reflectance), the black clothes become white clothes in an output image if Yir is used as it is as the luminance information. Such a problem can be prevented from occurring by providing the luminance synthesis unit 41.

Figure 7:
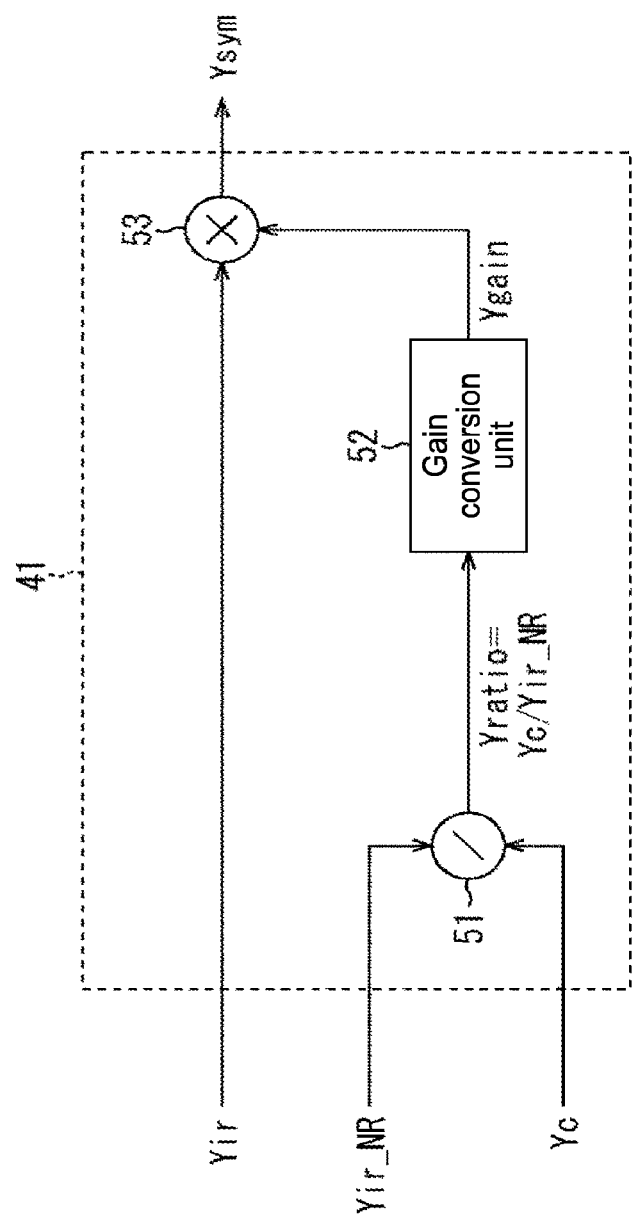
FIG. 7 A block diagram showing a configuration example of a movement synthesis unit.

FIG. 7 shows a specific configuration example of the luminance synthesis unit 41. The luminance synthesis unit 41 is configured by a division unit 51, a gain conversion unit 52, and a multiplication unit 53. The division unit 51 calculates a ratio Yratio=Yc/Yir_NR of the luminance information Yc in a low frequency range of the visible image and the luminance information Yir_NR in a low frequency range of the infrared image and outputs the obtained ratio Yratio to the gain conversion unit 52. The gain conversion unit 52 converts the ratio Yratio into Ygain in accordance with a predetermined function (or stored conversion table) and outputs it to the multiplication unit 53.

Here, the function used in the gain conversion unit 52 will be described. In the luminance synthesis unit 41, processing of modulating Yir by the Yc signal is basically carried out by multiplying back (multiplying) the luminance information Yir of the original infrared image by this ratio Yratio.

However, the entire screen tends to become dark with a simple multiplication, and a modulation degree by Yc cannot be adjusted. In this regard, in the gain conversion unit 52, the ratio Yratio is converted into Ygain using a nonlinear function curve.

Figure 8:
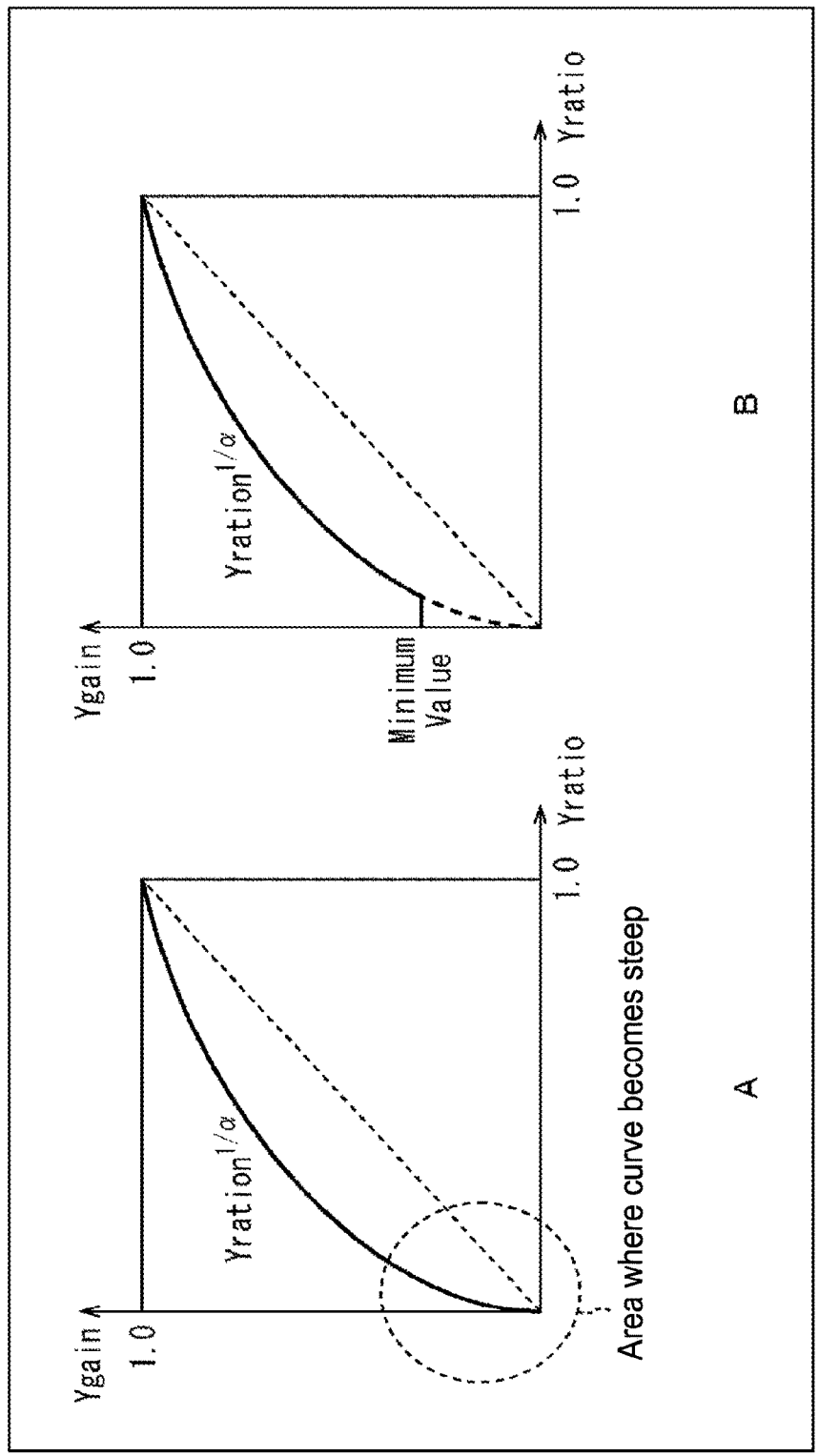
FIG. 8 Diagrams each showing a function used in a gain conversion unit.

FIG. 8A shows an exponent function similar to a gamma curve as an example of the nonlinear function used in the gain conversion unit 52. In this case, the modulation degree can be adjusted by selecting an exponent value α. For example, by increasing the value of α, Ygain approaches 1 as a whole, and the modulation degree becomes lower. Conversely, by decreasing the value of α, Ygain draws farther away from 1, and the modulation degree becomes higher.

It should be noted that in the exponent function curve as that shown in FIG. 8A, a tilt becomes steep in an area where the value of Yratio is small, and Ygain may largely fluctuate due to a slight difference in Yratio, to thus cause noise amplification. In this regard, to avoid such a problem, Ygain is clipped (minimum value is set) in the area where Yratio is small as shown in FIG. 8B. It should be noted that the gain conversion unit 52 may store a conversion table created in advance instead of using such a function.

Referring back to FIG. 7, the multiplication unit 53 multiplies back (multiplies) the luminance information Yir of the infrared image by Ygain to calculate luminance information Ysym and outputs it to the subsequent γ correction unit 42.

Referring back to FIG. 6, the γ correction unit 42 carries out γ correction processing on the luminance information Ysym input from the luminance synthesis unit 41 and outputs the luminance information Ysym subjected to the γ correction processing to the RGB conversion unit 43.

The RGB conversion unit 43 generates, on the basis of the color difference information Cb and Cr from the YCC conversion unit 40 and the luminance information Ysym subjected to the γ correction processing, that has been input from the γ correction unit 42, one color image in which pixels respectively include R, G, B color information for each one frame period and outputs it to the subsequent stage.

Regarding Color Image Generation Processing by Camera DSP Unit 14

Figure 9:
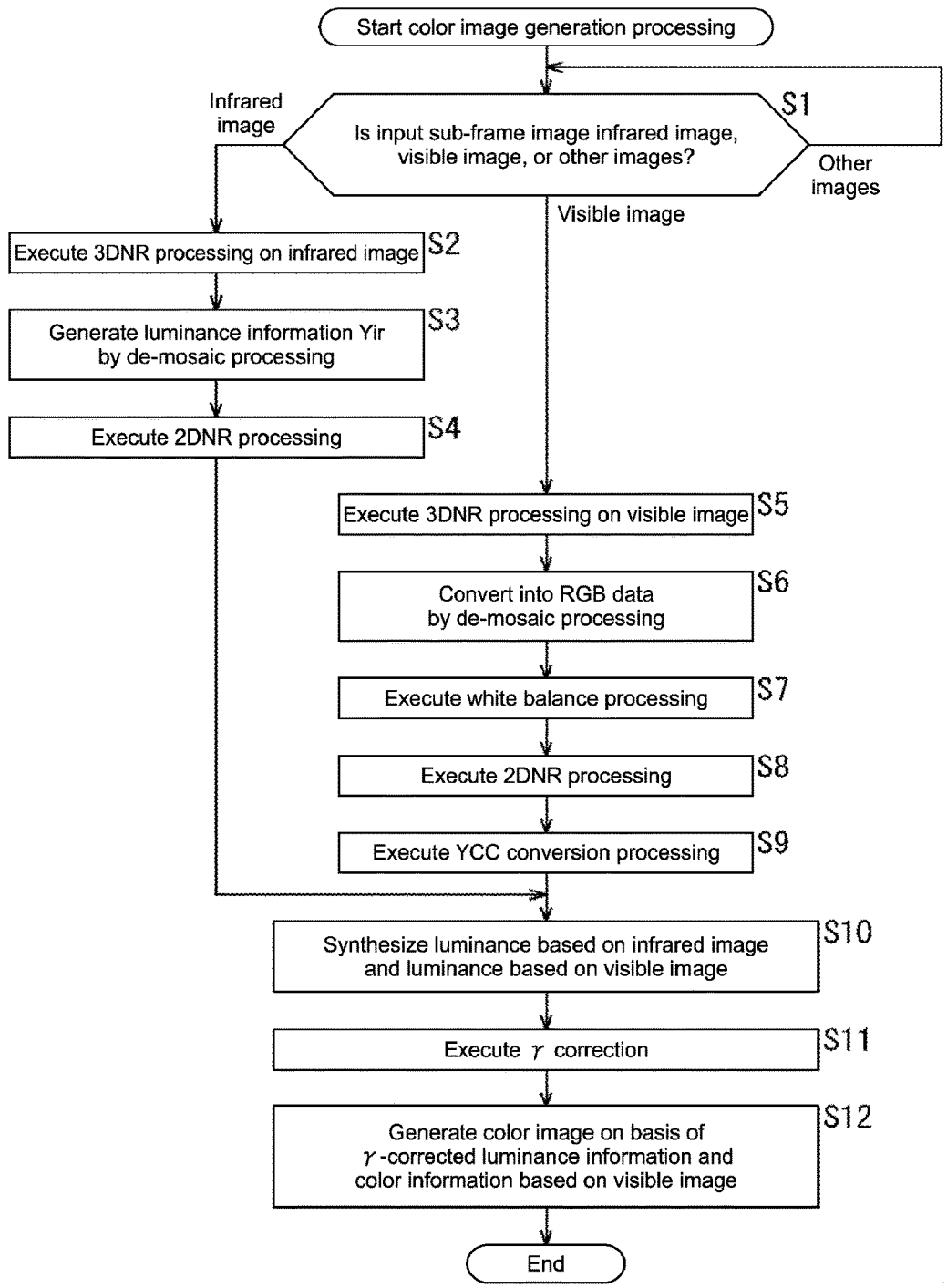
FIG. 9 A flowchart for explaining color image generation processing.

Next, FIG. 9 is a flowchart for explaining color image generation processing carried out by the camera DSP unit 14.

The color image generation processing is executed per frame period and presupposes that the 4 sub-frame images SF1 to SF4 are input from the CMOS 13 to the camera DSP unit 14 during the one frame period.

In Step S1, the 4 sub-frame images input from the CMOS 13 during the one frame period are allocated to the infrared image processing system, the visible image processing system, or others (discard). Specifically, the sub-frame image SF2 is allocated to the infrared image processing system so that processing of Steps S2 to S4 is carried out. Moreover, the sub-frame image SF4 is allocated to the visible image processing system so that processing of Steps S5 to S9 is carried out. The sub-frame images SF1 and SF3 are discarded.

In Step S2, in the infrared image processing system, the 3DNR unit 33 carries out the 3DNR processing on the infrared image (sub-frame image SF2) input from the CMOS 13 and outputs the infrared image subjected to the 3DNR processing to the de-mosaic unit 34 and overwrites and records it in the frame memory 16.

In Step S3, the de-mosaic unit 34 extracts luminance information Yir of the pixels from the infrared image subjected to the 3DNR processing (RAW data) and outputs it to the 2DNR unit 35 and the luminance synthesis unit 41. In Step S4, the 2DNR unit 35 carries out 2D noise reduction processing on the luminance information Yir of the infrared image to extract low-frequency components thereof, and outputs luminance information Yir_NR obtained as a result of the processing to the luminance synthesis unit 41.

In Step S5, in the visible image processing system, the 3DNR unit 36 carries out the 3DNR processing on the visible image (sub-frame image SF4) input from the CMOS 13 and outputs the visible image subjected to the 3DNR processing to the de-mosaic unit 37 and overwrites and records it in the frame memory 15.

In Step S6, the de-mosaic unit 37 converts the image signals subjected to the 3DNR processing (RAW data) into RGB data and outputs it to the WB unit 38. In Step S7, the WB unit 38 carries out white balance processing on the image signals (RAW data) and outputs them to the 2DNR unit 39.

In Step 8, the 2DNR unit 39 carries out the 2DNR processing on the visible image subjected to the white balance processing (RGB data) and outputs the resultant to the YCC conversion unit 40. In Step S9, the YCC conversion unit 40 converts the visible image subjected to the 2DNR processing (RGB data) into a visible image (YCC data), outputs luminance information Yc to the luminance synthesis unit 41, and outputs the color difference information Cb and Cr to the RGB conversion unit 43.

In Step S10, in the color image generation system that has acquired the processing results from the infrared image processing system and the leg image processing system, the luminance synthesis unit 41 calculates luminance information Ysym of a color image to be generated in a subsequent stage on the basis of the luminance information Yir and luminance information Yir_NR of the infrared image input from the infrared image processing system and the luminance information Yc of the visible image input from the visible image processing system, and outputs it to the γ correction unit 42. In Step S11, the γ correction unit 42 carries out γ correction processing on the luminance information Ysym input from the luminance synthesis unit 41 and outputs the luminance information Ysym subjected to the γ correction processing to the RGB conversion unit 43.

In Step S12, the RGB conversion unit 43 generates, on the basis of the color difference information Cb and Cr from the YCC conversion unit 40 and the luminance information Ysym subjected to the γ correction processing, that has been input from the γ correction unit 42, one color image in which pixels respectively include R, G, B color information for each one frame period and outputs it to the subsequent stage. Heretofore, the color image generation processing has been described.

By the color image generation processing described heretofore, a color image having highly-accurate color reproducibility can be generated on the basis of the infrared image and visible image output from the CMOS 13 that uses the focal plane reading system.

Modified Examples

Figure 10:
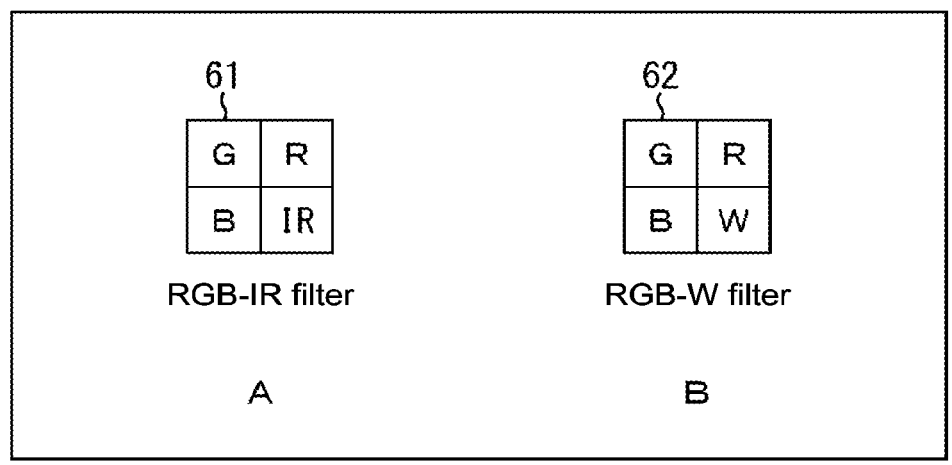
FIG. 10 Diagrams each showing a modified example of a color arrangement of CMOS color filters.

Next, a modified example of the image pickup apparatus 10 will be described. FIG. 10 each show a modified example of the color filter 21a that covers the light reception surface of the CMOS 13. In the descriptions above, the color filter 21a is constituted of color filters of R, G, and B in a Bayer array, but it is also possible to adopt an RGB-IR filter 61 shown in FIG. 10A, that is constituted of the respective color filters of R, G, and B and an IR filter that transmits infrared light, in place of the color filter 21a. When adopting the RGB-IR filter 61, it is only necessary to use values obtained from IR pixels as pixel values of an infrared image and use values obtained by IR signal subtraction processing (processing of subtracting pixel values of IR pixels from pixels values of R, G, and B pixels) as pixel values of a visible image.

Alternatively, an RGB-W filter 62 shown in FIG. 10B, that is constituted of the respective color filters of R, G, and B and a portion where a filter is not provided so as to transmit a full visible light band, may be adopted. In the case of adopting the RGB-W filter 62, values calculated from R, G, B, and W pixels by calculation processing may be used as pixel values of an infrared image and visible image.

Furthermore, by adopting the RGB-IR filter 61 or the RGB-W filter 62, it becomes possible to separate infrared light that is not irradiated from the IR irradiation unit 18 but exists in an environment and visible light from each other, the separation having been impossible with the color filters in the Bayer array.

Second Example of Image Pickup Timing by CMOS 13

Figure 11:
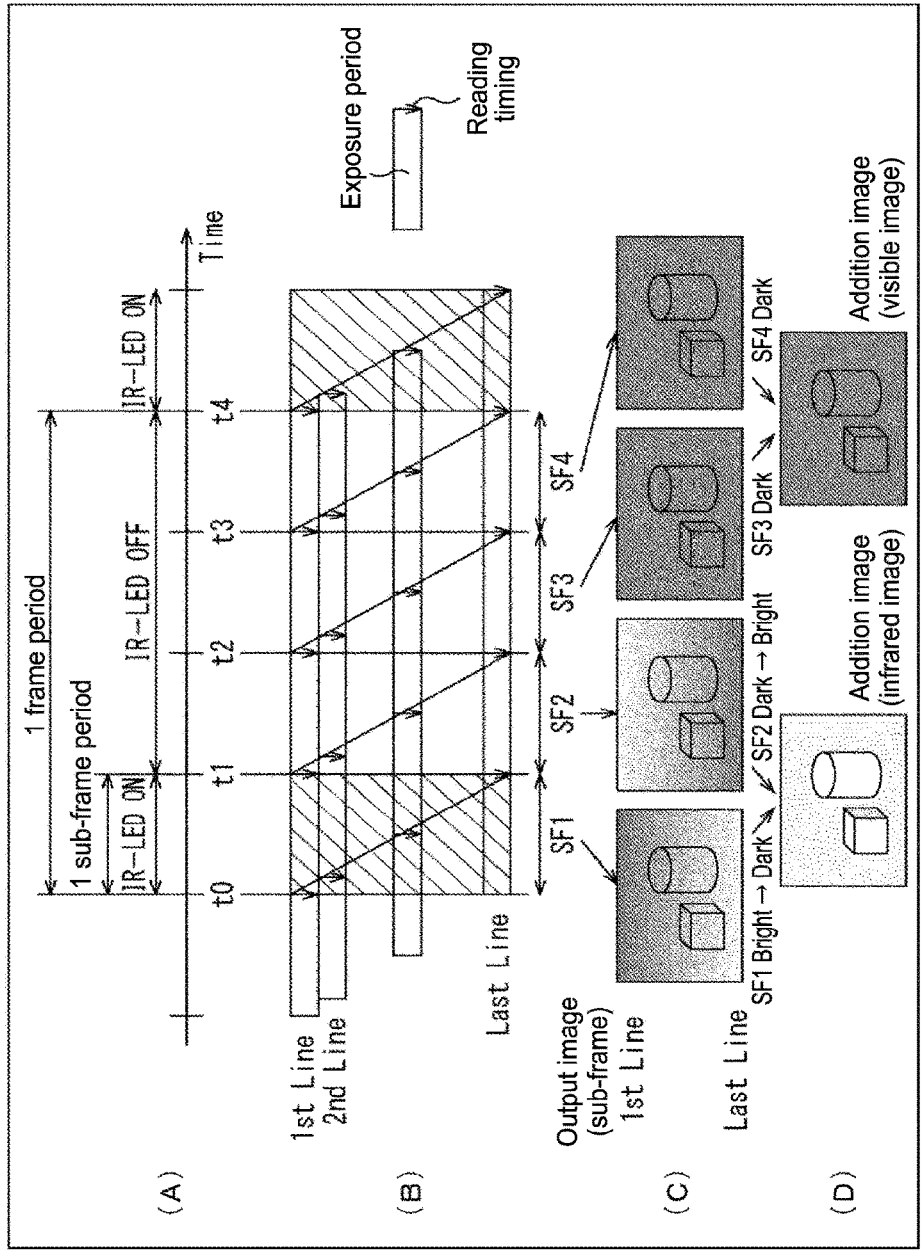
FIG. 11 Diagrams showing a second example of the image pickup timing.

Next, FIG. 11 show a second example of the image pickup timing by the CMOS 13.

Similar to the first example shown in FIG. 5, the second example of the image pickup timing enables 4 sub-frame images to be output from the CMOS 13 during one frame period. It should be noted that an infrared light irradiation timing differs from the first example.

Specifically, in the second example, of the 4 sub-frame periods in the one frame period, the irradiation of infrared light is turned on in one common sub-frame period within the frame periods, and the irradiation of infrared light is turned off in the other 3 sub-frame periods. It should be noted that although the irradiation of infrared light is turned on in the first sub-frame period (t0 to t1) in the one frame period in the case of FIG. 11, the irradiation of infrared light may be turned on in other sub-frame periods.

In the sub-frame image SF1 in the second example shown in FIG. 11, lines near the head of sweeping (1st-Line) become dark since a time during which the irradiation of infrared light is turned on within an exposure period is short and gradually become brighter as the sweeping progresses since the time during which the irradiation of infrared light is turned on becomes longer. In the sub-frame image SF2, a light-dark change becomes opposite to that of the sub-frame image SF1, and an image that gradually darkens as the sweeping progresses since the time during which the irradiation of infrared light is turned on becomes shorter is obtained. The sub-frame images SF3 and SF4 become images that are based only on visible light and with which the entire screen becomes dark since the irradiation of infrared light is turned off throughout the entire exposure period of all lines.

It should be noted that when looking at the time during which the irradiation of infrared light is turned on in the exposure times of the sub-frame image SF1 and the sub-frame image SF2, it can be said that luminance gradations of the sub-frame image SF1 and the sub-frame image SF2 are in a complementary relationship. Therefore, when both are added, an image corresponding to a state where infrared light is irradiated throughout the entire period (one sub-frame period) of the exposure period can be obtained across all the lines. Accordingly, an infrared image is generated by adding (or averaging) the corresponding pixels of the sub-frame image SF1 and the sub-frame image SF2.

Similarly, when looking at the exposure time with respect to a state where the irradiation of infrared light is turned off in the sub-frame image SF3 and the sub-frame image SF4, an image corresponding to a state where an image is captured using only visible light can be obtained in the exposure period of two sub-frame periods obtained by adding those two. Accordingly, a visible image is generated by adding (or averaging) the corresponding pixels of the sub-frame image SF3 and the sub-frame image SF4.

Second Configuration Example of Camera DSP Unit 14

Figure 12:
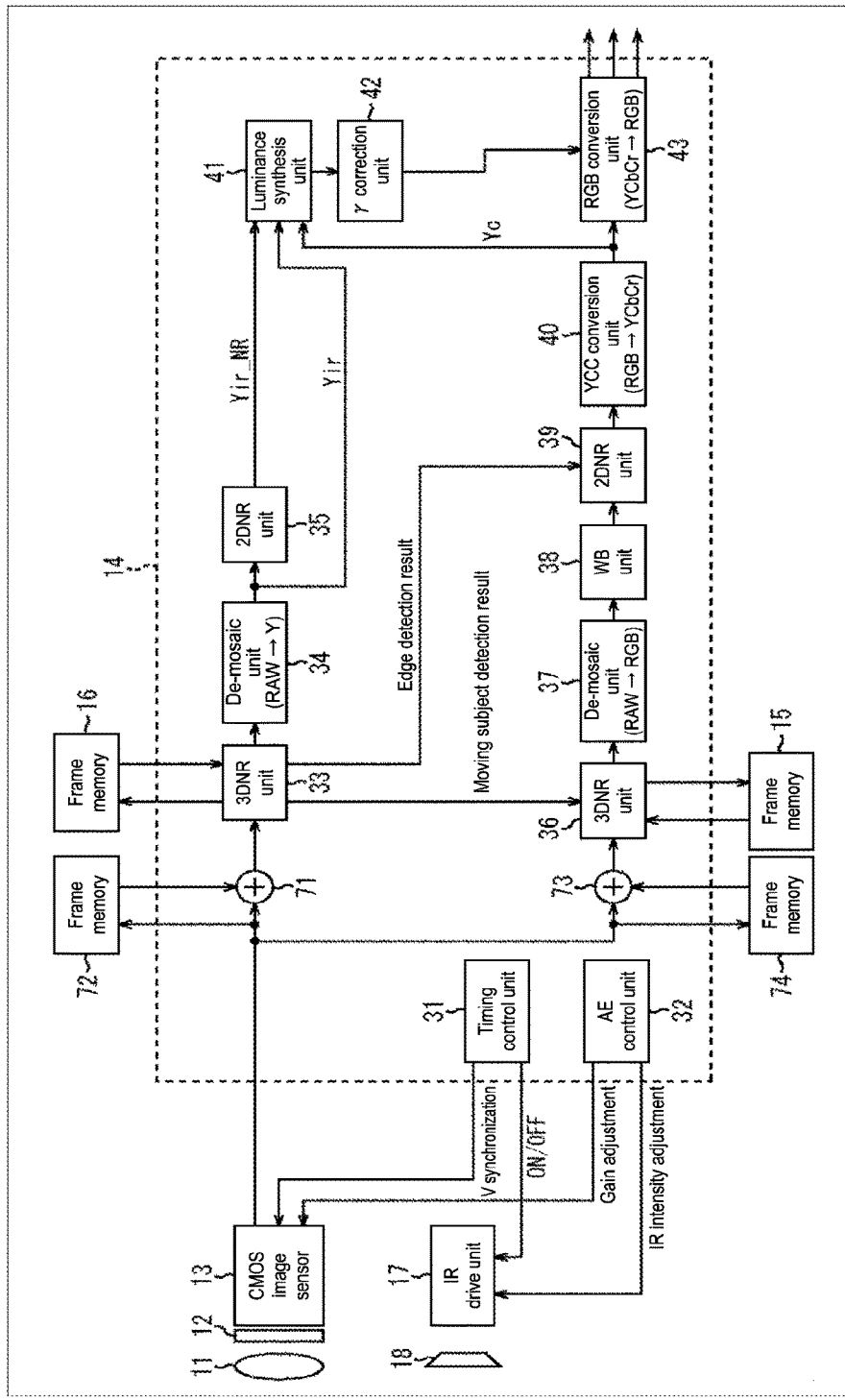
FIG. 12 A block diagram showing a first configuration example of the camera DSP unit.

Next, FIG. 12 shows a second configuration example of the camera DSP unit 14, that corresponds to the second example of the image pickup timing shown in FIG. 11.

The second configuration example is obtained by adding an addition unit 71 and a frame memory 72 before the infrared image processing system of the first configuration example shown in FIG. 6 and adding an addition unit 73 and a frame memory 74 before the visible image processing system.

The addition unit 71 of the infrared image processing system generates an infrared image by adding (or averaging) the sub-frame image SF1 that is input first and stored in the frame memory 72 and the sub-frame image SF2 and outputs it to the 3DNR unit 33. The addition unit 73 of the visible image processing system generates a visible image by adding (or averaging) the sub-frame image SF that is input first and stored in the frame 74 and the sub-frame image SF4 and outputs it to the 3DNR unit 36.

It should be noted that since configurations and operations of subsequent stages of the 3DNR unit 33 and the 3DNR unit 36 are similar to those of the first configuration example shown in FIG. 6, descriptions thereof will be omitted.

According to the second configuration example of the camera DSP unit 14, it is possible to generate an infrared image and visible image from the sub-frame images SF1 to SF4 output from the CMOS 13 that uses the focal plane reading system and generate a color image having highly-accurate color reproducibility on the basis of those images.

Here, when comparing the first example and the second example regarding the visible image input to the visible image processing system, while the exposure time is one sub-frame period in the first example, the exposure time is two sub-frame periods in the second example. Since the visible image is presupposed to be captured under low illuminance in this embodiment, pixel values are not saturated even when the exposure time becomes long, and color information of a subject becomes more accurate as the exposure time becomes longer. Therefore, in the second configuration example, a color image in which color information is reproduced more accurately than in the first configuration example can be obtained.

It should be noted that in the second configuration example, the sub-frame image SF3 or SF4 may be output to the 3DNR unit 36 as a visible image without using the addition unit 73 and the frame memory 74 of the visible image processing system. In this case, since the exposure time of the visible image is one sub-frame period, a color image in which color information is reproduced with the same level of accuracy as the first configuration example can eventually be obtained.

Third Example of Image Pickup Timing by CMOS 13

Figure 13:
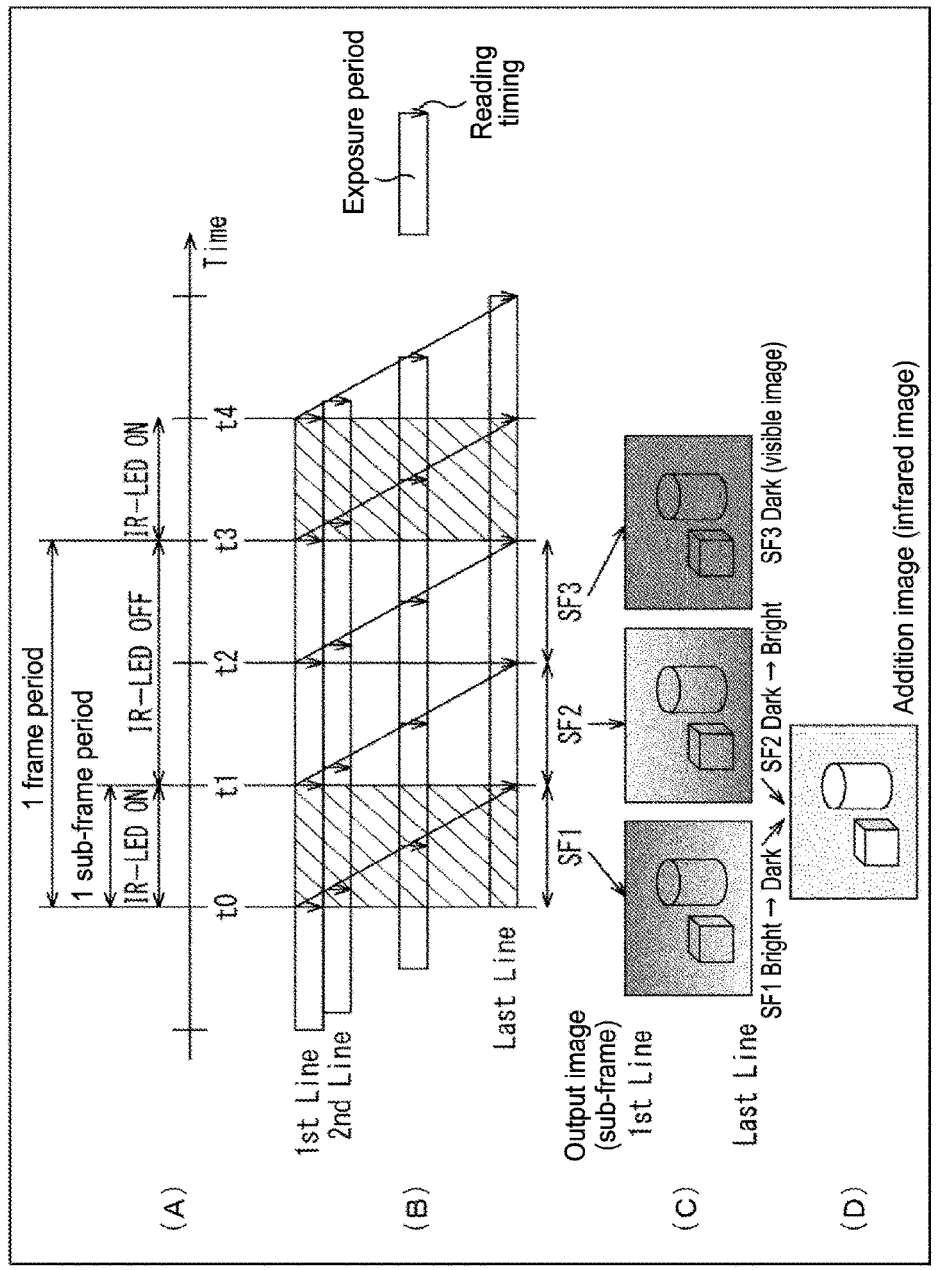
FIG. 13 Diagrams showing a third example of the image pickup timing.

Next, FIG. 13 show a third example of the image pickup timing by the CMOS 13.

In the third example, in the CMOS 13, one frame period (1/30 sec in a case of 30 fps) of a frame rate of a color image to be eventually output (e.g., 30 fps) is divided into 3 so that, with a sub-frame period (1/90 sec in the case of 30 fps) being a one-screen sweeping period of the CMOS 13, 3 sub-frame images are output from the CMOS 13 during the one frame period.

In capturing 3 sub-frames during the one frame period, the irradiation of infrared light is turned on during one common sub-frame period within the frame periods out of the 3 sub-frame periods in the one frame period, and the irradiation of infrared light is turned off during the other two sub-frame periods. It should be noted that although the irradiation of infrared light is turned on in the first sub-frame period (t0 to t1) in the one frame period in the case of FIG. 13, the irradiation of infrared light may be turned on in the second or third sub-frame period, for example.

In the sub-frame image SF1 in the third example shown in FIG. 13, lines near the head of sweeping (1st-Line) become dark since a time during which the irradiation of infrared light is turned on within the exposure period is short and gradually become brighter as the sweeping progresses since the time during which the irradiation of infrared light is turned on becomes longer. In the sub-frame image SF2, a light-dark change becomes opposite to that of the sub-frame image SF1, and an image that gradually darkens as the sweeping progresses since the time during which the irradiation of infrared light is turned on becomes shorter is obtained. The sub-frame image SF3 becomes an image that is based only on visible light and with which the entire screen becomes dark since the irradiation of infrared light is turned off throughout the entire exposure period of all lines.

When looking at the time during which the irradiation of infrared light is turned on in the exposure times of the sub-frame image SF1 and the sub-frame image SF2, when both are added, an image corresponding to a state where infrared light is irradiated throughout the entire period (one sub-frame period) of the exposure period can be obtained across all the lines. Accordingly, an infrared image is generated by adding (or averaging) the corresponding pixels of the sub-frame image SF1 and the sub-frame image SF2. The remaining sub-frame image SF3 is used as it is as a visible image.

Regarding a configuration example of the camera DSP unit 14, that corresponds to the third example of the image pickup timing, the second configuration example described above can be applied. It should be noted that the addition unit 73 and the frame memory 74 provided before the visible image processing system can be omitted.

Also in this case, the camera DSP unit 14 can generate a color image having highly-accurate color reproducibility on the basis of the sub-frame images SF1 to SF3 output from the CMOS 13 that uses the focal plane reading system.

Here, when comparing the first example and the third example regarding the visible image input to the visible image processing system, while one sub-frame period as the exposure time is 1/4 the frame period in the first example, the exposure time is 1/3 the frame period in the third example.

Here, if the frame rate is common in the first example and the third example, the exposure time of the visible image in the third example becomes longer than that of the first example. Since the visible image is presupposed to be captured under low illuminance in this embodiment, pixel values are not saturated even when the exposure time becomes long, and color information of a subject becomes more accurate as the exposure time becomes longer. Therefore, in this case, a color image in which color information is reproduced more accurately than in the first example can be obtained.

Further, if the time of the sub-frame period is common in the first example and the third example, a color image can be output at a higher frame rate in the third example than in the first example. For example, in a case where a common sub-frame period is 1/120 sec, the frame rate of a color image becomes 30 fps in the first example whereas the frame rate becomes 40 fps in the third example.

Fourth Example of Image Pickup Timing by CMOS 13

In the first to third examples of the image pickup timing described above, an electronic shutter of the CMOS 13 is kept open (exposure period and one-screen sweeping period match), but the electronic shutter can be opened/closed.

Figure 14:
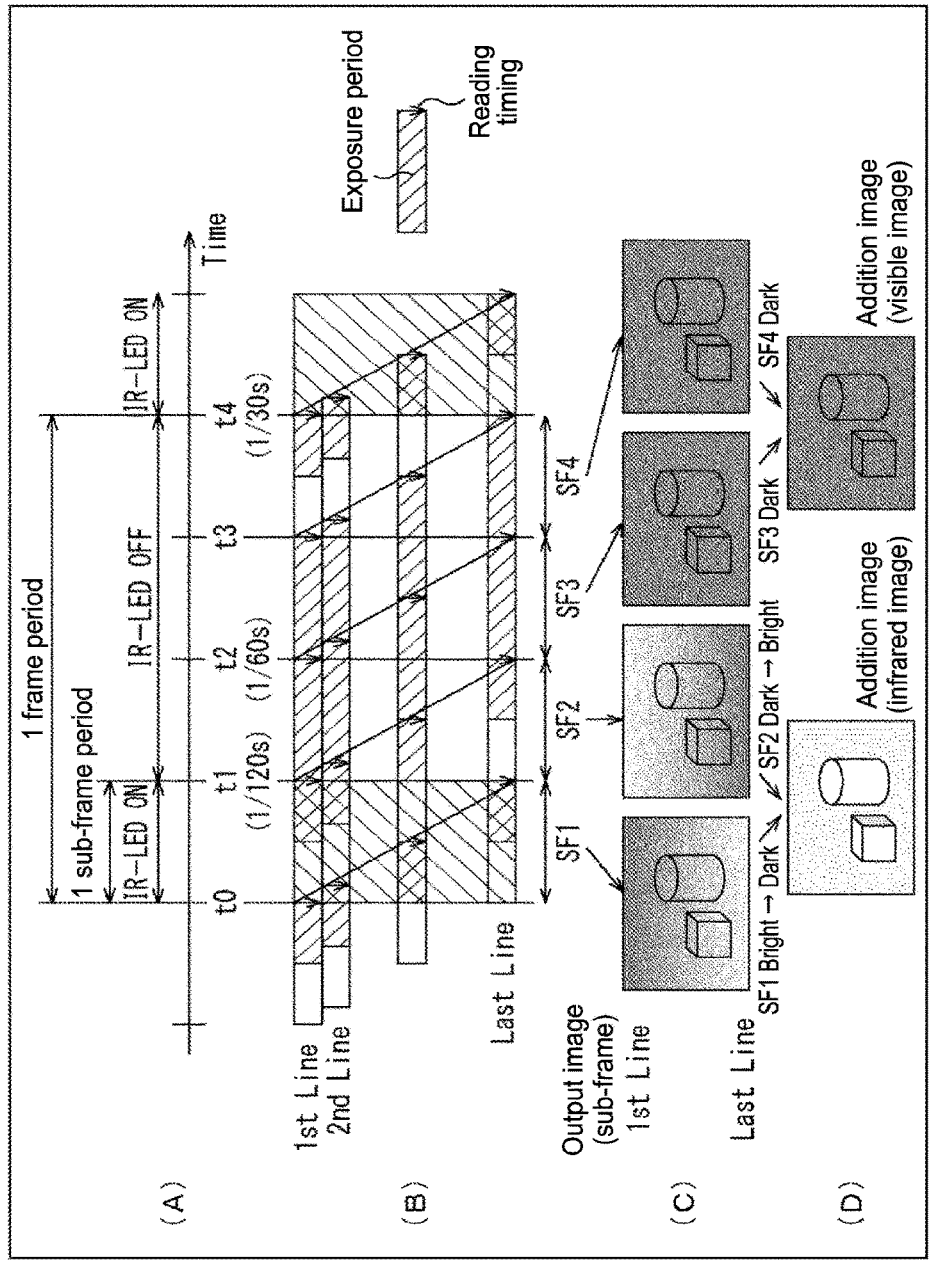
FIG. 14 Diagrams showing a fourth example of the image pickup timing.

FIG. 14 show a fourth example of the image pickup timing of adaptively opening/closing the electronic shutter of the CMOS 13. For example, in the case of capturing a visible image under low illuminance, the electronic shutter can be kept open for gaining sensitivity, and in the case of capturing an infrared image, the exposure time can be adjusted to become shorter than a one-screen operation period by the electronic shutter in accordance with brightness of the screen.

Similar to the second example of the image pickup timing, in the fourth example of the image pickup timing, a color image can be generated by the second configuration example of the camera DSP unit 14 on the basis of the 4 sub-frame images SF1 to SF4 obtained per frame period.

Fifth Example of Image Pickup Timing by CMOS 13

In the first to fourth examples of the image pickup timing described above, the on/off timing of the irradiation of infrared light matches with breakpoints of the sub-frame periods, but those do not always need to match.

Figure 15:
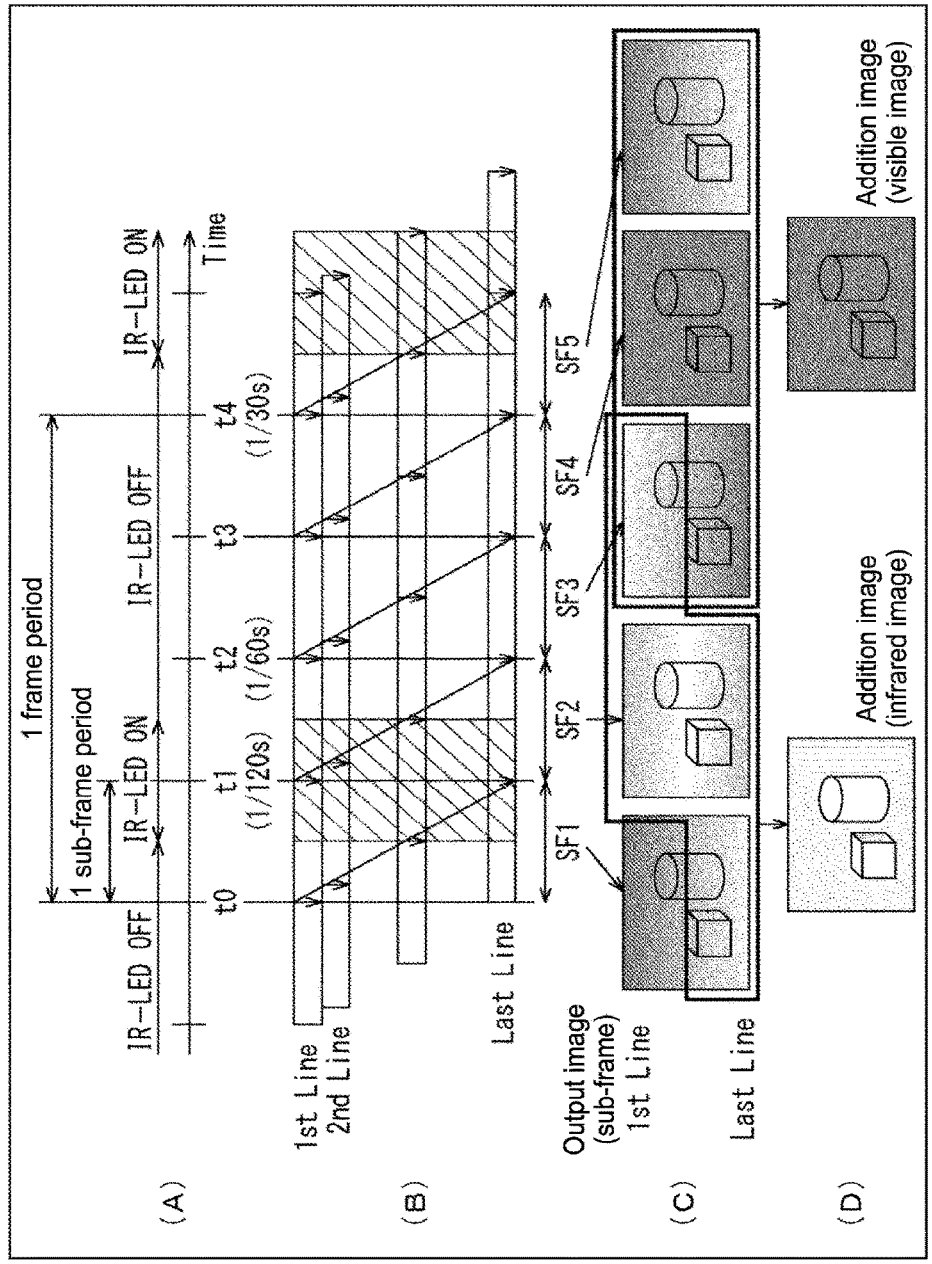
FIG. 15 Diagrams showing a fifth example of the image pickup timing.

FIG. 15 show a fifth example of the image pickup timing where the on/off timing of the irradiation of infrared light does not match with the breakpoints of the sub-frame periods.

In the fifth example, the irradiation of infrared light is turned on only for a time corresponding to one sub-frame period at an arbitrary timing within one frame period constituted of 4 sub-frame periods in the one frame period, and the irradiation of infrared light is turned off for the time corresponding to the other 3 sub-frame periods. It should be noted that in the case of FIG. 15, the irradiation of infrared light is turned on for a time corresponding to one sub-frame period from the middle of the first sub-frame period (t0 to t1) to the middle of the second sub-frame period (t1 to t2) in the one frame period, but the irradiation of infrared light may be turned on for a time corresponding to one sub-frame period at other timings.

In the fifth example shown in FIG. 15, the sub-frame image SF1 becomes an image that gradually becomes brighter since the irradiation of infrared light is turned off from the head of sweeping (1st-Line) to a line near the center and a time during which the irradiation of infrared light is turned on becomes longer from the line near the center.

Since the time during which the irradiation of infrared light is turned on becomes longer from the head of sweeping (1st-Line) to the line near the center and the time during which the irradiation of infrared light is turned on becomes shorter from the line near the center to the last sweeping line (Last-Line), the sub-frame image SF2 becomes an image that gradually becomes brighter from the head of sweeping to the line near the center, becomes most bright near the middle, and gradually becomes dark as the sweeping progresses from that point.

Since the irradiation of infrared light is turned off throughout the entire exposure period of all the lines, the sub-frame image SF4 becomes an image that is based only on visible light and with which the entire screen becomes dark.

In the camera DSP unit 14, an infrared image is synthesized by adding (or averaging) a lower half of the sub-frame image SF1, the entire sub-frame image SF2, and a lower half of the sub-frame image SF3, and the infrared image is used for the processing in the infrared image processing system.

Moreover, in the camera DSP unit 14, a visible image is synthesized by adding (or averaging) the sub-frame image SF3, the sub-frame image SF4, and a sub-frame image SF5 (sub-frame image SF1 of next frame period), and the visible image is used for the processing in the visible image processing system.

It should be noted that similar to the synthesis of an infrared image, the synthesis of a visible image may be performed by adding (or averaging) a lower half of the sub-frame image SF3, the sub-frame image SF4, and an upper half of the sub-frame image SF5. However, since infrared light components are included in the sub-frame image SF3 and the sub-frame image SF5, the images cannot be used as they are in the synthesis of a visible image. As a countermeasure, the RGB-IR filter 61 or the RGB-W filter 62 shown in FIG. 10 only need to be adopted in the CMOS 13. In this case, visible light components can be extracted by carrying out the IR signal subtraction processing (processing of subtracting IR signal from RGB signals). Therefore, visible light components are extracted from the sub-frame image SF3 and the sub-frame image SF5 by the IR signal subtraction processing to thus be used for the synthesis of a visible image.

Since the visible image is constituted of 3 sub-frame images in the case of the fifth example, an exposure time thereof is substantially 3 sub-frame periods and becomes about 1.5 times the exposure time of the visible image in the second or third example. Since the visible image is presupposed to be captured under low illuminance in this embodiment, pixel values are not saturated even when the exposure time becomes long, and color information of a subject becomes more accurate as the exposure time becomes longer. Therefore, in the fifth example, a color image in which color information is reproduced more accurately than in the second or third example can be obtained.

In general, if the infrared light components are large with respect to the visible light components in an image, subtraction accuracy is lowered to cause many noises in the visible light components in the IR signal subtraction processing. However, since the infrared light components in the upper part of the sub-frame image SF3 and the lower part of the sub-frame image SF5 correspond to timings close to on or off of the irradiation of infrared light as in the fifth example, the infrared light components are weaker than those of the sub-frame image SF2. Accordingly, visible light components can be extracted accurately even by the IR signal subtraction processing described above.

Further, in the upper part of the sub-frame image SF3 and the lower part of the sub-frame image SF5, the intensity of infrared light components at a center portion of the image becomes weaker than at upper and lower ends of the image. Therefore, it becomes possible to enhance quality of the visible light components at the center portion that is most important in the image.

CONCLUSION

In the embodiment described heretofore, color information used for generating a color image is extracted only from a visible image. However, it is also possible to extract color components from an infrared image and use them to generate a color image. Specifically, it is possible to adopt the RGB-IR filter 61 shown in FIG. 10A in the CMOS 13 so that, by carrying out the IR signal subtraction processing on the infrared image, color information of only visible light can be extracted. By using a combination of this color information extracted from infrared light and the color information extracted from the visible image to generate a color image, a color image having high color reproducibility can be obtained.

Further, although one frame period is divided into 3 or 4 sub-frame periods in the embodiment above, it is also possible to divide one frame period into 5 or more sub-frame periods, synthesize an infrared image and a visible image from the obtained sub-frame images, and generate a color image on the basis of those images.

Incidentally, the series of processing described above may be executed either by software or hardware. In a case where the series of processing is executed by software, a program configuring that software is installed in a computer. Here, the computer includes a computer incorporated into dedicated hardware, a computer capable of executing various functions by installing various programs, such as a general-purpose personal computer, and the like.

Figure 16:
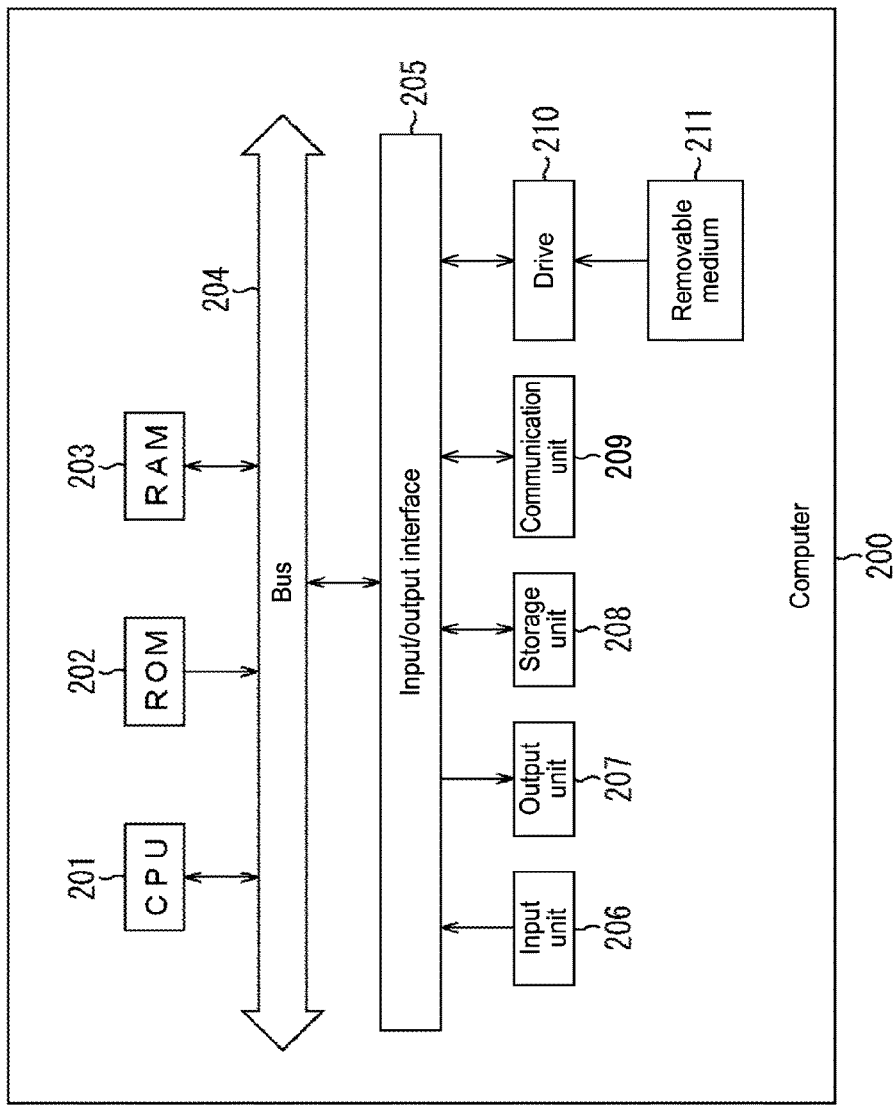
FIG. 16 A block diagram showing a configuration example of a computer.

FIG. 16 is a block diagram showing a hardware configuration example of a computer that executes the series of processing described above by a program.

In a computer 200, a CPU (Central Processing Unit) 201, a ROM (Read Only Memory) 202, and a RAM (Random Access Memory) 203 are connected to one another via a bus 204.

Also connected to the bus 204 is an input/output interface 205. An input unit 206, an output unit 207, a storage unit 208, a communication unit 209, and a drive 210 are connected to the input/output interface 205.

The input unit 206 is constituted of a keyboard, a mouse, a microphone, and the like. The output unit 207 is constituted of a display, a speaker, and the like. The storage unit 208 is constituted of a hard disk, a nonvolatile memory, and the like. The communication unit 209 is constituted of a network interface and the like. The drive 210 drives a removable medium 211 such as a magnetic disk, an optical disc, a magneto-optical disc, and a semiconductor memory.

In the computer 200 configured as described above, the CPU 201 loads a program stored in the storage unit 208 to the RAM 203 via the input/output interface 205 and the bus 204 and executes it, to carry out the series of processing described above, for example.

The program executed by the computer 200 (CPU 201) can be provided by being recorded onto the removable medium 211 as a package medium, for example. The program can also be provided via wired or wireless transmission media such as a local area network, the Internet, and digital satellite broadcasting.

It should be noted that the program executed by the computer 200 may be a program in which processing are carried out in time series in the order described in the specification or may be a program in which processing are carried out in parallel or at necessary timings such as when invoked.

The embodiment of the present disclosure is not limited to the embodiment described above and can be variously modified without departing from the gist of the present disclosure.

The present disclosure may also take the following configurations.

(1) An image pickup apparatus, including:
an image pickup device that divides one frame period corresponding to a predetermined frame rate into 3 or more sub-frame periods and sweeps pixel values of an entire screen for each of the sub-frame periods using a focal plane reading system to generate, in the one frame period, sub-frame images in a number corresponding to the number of sub-frame periods;
an infrared light irradiation unit that turns on/off irradiation of infrared light onto an image pickup range in a time length unit that is the same as the sub-frame period in the one frame period; and
a color image generation unit that generates a color image at the predetermined frame rate on the basis of an infrared image based on the sub-frame image in which a period during which the infrared light is irradiated is included in an exposure time and a visible image based on the sub-frame image in which the period during which the infrared light is irradiated is not included in the exposure time.

(2) The image pickup apparatus according to (1), in which
the color image generation unit includes
an infrared image generation unit that generates an infrared image from the plurality of sub-frame images in which the period during which the infrared light is irradiated is included in the exposure time.

(3) The image pickup apparatus according to (2), in which
the infrared image generation unit generates the infrared image from the plurality of sub-frame images whose luminance gradations are in a complementary relationship, the plurality of sub-frame images having the period during which the infrared light is irradiated included in the exposure time.

(4) The image pickup apparatus according to any one of (1) to (3), in which
the color image generation unit further includes
a visible image generation unit that generates the visible image from the plurality of sub-frame images in which the period during which the infrared light is irradiated is not included in the exposure time.

(5) The image pickup apparatus according to any one of (1) to (4), in which
the color image generation unit further includes
an infrared image conversion unit that extracts luminance information from the infrared image,
a visible image conversion unit that extracts color difference information from the visible image, and
a color image conversion unit that converts the luminance information of the infrared image and the color difference information of the visible image into color information of the color image.

(6) The image pickup apparatus according to (5), in which
the visible image conversion unit also extracts luminance information from the visible image, and
the color image conversion unit converts the luminance information of the infrared image and the color difference information of the visible image into the color information of the color image, the luminance information and the color difference information having been corrected using the luminance information of the visible image.

(7) The image pickup apparatus according to any one of (1) to (6), in which
the color image generation unit further includes
a first 3DNR unit that carries out 3DNR processing including time direction processing on the infrared image, and
a second 3DNR unit that carries out the 3DNR processing including the time direction processing on the visible image, and
a feedback ratio of the time direction processing in the first 3DNR unit and a feedback ratio of the time direction processing in the second 3DNR unit differ.

(8) The image pickup apparatus according to (7), in which
the second 3DNR unit carries out the 3DNR processing on the visible image using a moving subject detection result supplied from the first 3DNR unit.

(9) The image pickup apparatus according to (7) or (8), in which
the color image generation unit further includes
a 2DNR unit that carries out 2DNR processing on the visible image using an edge detection result supplied from the first 3DNR unit.

(10) The image pickup apparatus according to any one of (1) to (9), in which
a light reception surface of the image pickup device is covered by a color filter in a Bayer array, an RGB-IR filter, or an RGB-W filter.

(11) The image pickup apparatus according to any one of (1) to (10), in which
the image pickup device includes an electronic shutter function, and the exposure time during image pickup of the sub-frame images that are to become a base of the infrared image differs in a time length from the exposure time during image pickup of the sub-frame images that are to become a base of the visible image.

(12) The image pickup apparatus according to any one of (1) to (11), in which
the image pickup device includes an amplification unit that amplifies pixel signals and an electronic shutter function, and a gain of the amplification unit differs between the time of image pickup of the sub-frame images that are to become a base of the infrared image and the time of image pickup of the sub-frame images that are to become a base of the visible image.

(13) An image pickup method for an image pickup apparatus including an image pickup device, an infrared light irradiation unit, and a color image generation unit, the method including the steps of:
dividing, by the image pickup device, one frame period corresponding to a predetermined frame rate into 3 or more sub-frame periods and sweeping pixel values of an entire screen for each of the sub-frame periods using a focal plane reading system to generate, in the one frame period, sub-frame images in a number corresponding to the number of sub-frame periods;
turning on/off, by the infrared light irradiation unit, irradiation of infrared light onto an image pickup range in a time length unit that is the same as the sub-frame period in the one frame period; and generating, by the color image generation unit, a color image at the predetermined frame rate on the basis of an infrared image based on the sub-frame image in which a period during which the infrared light is irradiated is included in an exposure time and a visible image based on the sub-frame image in which the period during which the infrared light is irradiated is not included in the exposure time.

(14) A program for controlling a computer of an image pickup apparatus including an image pickup device and an infrared light irradiation unit to execute processing including the steps of:

dividing, by the image pickup device, one frame period corresponding to a predetermined frame rate into 3 or more sub-frame periods and sweeping pixel values of an entire screen for each of the sub-frame periods using a focal plane reading system to generate, in the one frame period, sub-frame images in a number corresponding to the number of sub-frame periods;

turning on/off, by the infrared light irradiation unit, irradiation of infrared light onto an image pickup range in a time length unit that is the same as the sub-frame period in the one frame period; and generating a color image at the predetermined frame rate on the basis of an infrared image based on the sub-frame image in which a period during which the infrared light is irradiated is included in an exposure time and a visible image based on the sub-frame image in which the period during which the infrared light is irradiated is not included in the exposure time.

(15) An image processing apparatus that receives, from an image pickup apparatus including an image pickup device that divides one frame period corresponding to a predetermined frame rate into 3 or more sub-frame periods and sweeps pixel values of an entire screen for each of the sub-frame periods using a focal plane reading system to generate, in the one frame period, sub-frame images in a number corresponding to the number of sub-frame periods, and an infrared light irradiation unit that turns on/off irradiation of infrared light onto an image pickup range in a time length unit that is the same as the sub-frame period in the one frame period, an input of the sub-frame images captured by the image pickup apparatus, the image processing apparatus including a color image generation unit that generates a color image at the predetermined frame rate on the basis of an infrared image based on the sub-frame image in which a period during which the infrared light is irradiated is included in an exposure time and a visible image based on the sub-frame image in which the period during which the infrared light is irradiated is not included in the exposure time.

REFERENCE SIGNS LIST 10 image pickup apparatus
14 camera DSP unit
18 IR irradiation unit
21a color filter
33 3DNR unit
34 de-mosaic unit
35 2DNR unit
36 3DNR unit
37 de-mosaic unit
38 WB unit
39 2DNR unit
40 YCC conversion unit
41 luminance synthesis unit
42 γ correction unit
43 RGB conversion unit
61 RGB-IR filter
62 RGB-W filter
71 addition unit
72 frame memory
73 addition unit
74 frame memory
200 computer
201 CPU

The invention claimed is:

1. An image pickup apparatus, comprising:
an image pickup device configured to divide one frame period corresponding to a predetermined frame rate into 3 or more sub-frame periods and generate, via a rolling shutter, in the one frame period, sub-frame images in a number corresponding to the number of sub-frame periods; and
processing circuitry configured to
turn on an infrared light source that irradiates infrared light onto an image pickup range in a time length unit that is equal to at least one of the 3 or more sub-frame periods in the one frame period, and
generate a color image at the predetermined frame rate based on an infrared image which is based on a first sub-frame image of the sub-frame images in which the infrared light is irradiated during a first exposure time of the first sub-frame image and a visible image which is based on a second sub-frame image of the sub-frame images in which the infrared light is not irradiated in a second exposure time of the second sub-frame image, wherein
the processing circuitry is configured to convert luminance information of the infrared image and color difference information of the visible image into color information of the color image based on luminance information of the visible image.

2. The image pickup apparatus according to claim 1, wherein the processing circuitry is configured to
generate the infrared image from the sub-frame images in which the infrared light is irradiated in the first exposure time.

3. The image pickup apparatus according to claim 1, wherein the processing circuitry is configured to
generate the infrared image from a pair of the sub-frame images having complementary luminance gradations.

4. The image pickup apparatus according to claim 1, wherein the processing circuitry is configured to
generate the visible image from the sub-frame images in which the infrared light is not irradiated in the second exposure time.

5. The image pickup apparatus according to claim 1, wherein the processing circuitry is configured to
extract the luminance information of the infrared image from the infrared image, and
extract the color difference information of the visible image from the visible image.

6. The image pickup apparatus according to claim 5, wherein the processing circuitry is configured to
extract the luminance information of the visible image from the visible image, and
the luminance information of the infrared image and the color difference information of the visible image are corrected using the luminance information of the visible image.

7. The image pickup apparatus according to claim 1, wherein the processing circuitry is configured to perform time direction processing on the infrared image, and perform time direction processing on the visible image, wherein a feedback ratio of the time direction processing on the infrared image and a feedback ratio of the time direction processing on the visible image differ.

8. The image pickup apparatus according to claim 7, wherein the processing circuitry is configured to perform the time direction processing on the visible image using a result of a moving subject detection.

9. The image pickup apparatus according to claim 8, wherein the processing circuitry is configured to perform noise reduction on the visible image using a result of an edge detection.

10. The image pickup apparatus according to claim 1, wherein a light reception surface of the image pickup device is covered by a color filter in a Bayer array, an RGB-IR filter, or an RGB-W filter.

11. The image pickup apparatus according to claim 1, wherein the image pickup device includes an electronic shutter function, and a third exposure time during image pickup of the sub-frame images that are to become a base of the infrared image differs in a time length from a fourth exposure time during image pickup of the sub-frame images that are to become a base of the visible image.

12. The image pickup apparatus according to claim 1, wherein the image pickup device includes an electronic shutter function, and processing circuitry configured to amplify pixel signals, wherein an amplification gain at a time of image pickup of the sub-frame images that are to become a base of the infrared image differs from an amplification gain at a time of image pickup of the sub-frame images that are to become a base of the visible image.

13. An image pickup method for an image pickup apparatus including an image pickup device, the method comprising:

dividing, by the image pickup device, one frame period corresponding to a predetermined frame rate into 3 or more sub-frame periods;

generating, via a rolling shutter, sub-frame images in a number corresponding to the number of sub-frame periods in the one frame period;

turning on, by processing circuitry, an infrared light source that irradiates infrared light onto an image pickup range in a time length unit that is equal to at least one of the 3 or more sub-frame periods in the one frame period;

generating, by the processing circuitry, a color image at the predetermined frame rate based on an infrared image which is based on a first sub-frame image of the sub-frame images in which the infrared light is irradiated during a first exposure time of the first sub-frame image and a visible image which is based on a second sub-frame image of the sub-frame images in which the infrared light is not irradiated in a second exposure time of the second sub-frame image; wherein the generating includes converting, by the processing circuitry, luminance information of the infrared image and color difference information of the visible image into color information of the color image based on luminance information of the visible image.

14. A non-transitory computer-readable storage medium storing computer-readable instructions that, when executed by a computer, cause the computer to perform a method, the method comprising:

dividing, by the image pickup device, one frame period corresponding to a predetermined frame rate into 3 or more sub-frame periods;

generating, via a rolling shutter, in the one frame period, sub-frame images in a number corresponding to the number of sub-frame periods;

turning on an infrared light source that irradiates infrared light onto an image pickup range in a time length unit that is equal to at least one of the 3 or more sub-frame periods in the one frame period;

generating a color image at the predetermined frame rate based on an infrared image which is based on a first sub-frame image of the sub-frame images in which the infrared light is irradiated during a first exposure time of the first sub-frame image and a visible image which is based on a second sub-frame image of the sub-frame images in which the infrared light is not irradiated in a second exposure time of the second sub-frame image; wherein the generating includes converting luminance information of the infrared image and color difference information of the visible image into color information of the color image based on luminance information of the visible image.

15. An image processing apparatus, comprising:

processing circuitry configured to receive, from an image pickup apparatus including an image pickup device that is configured to divide one frame period corresponding to a predetermined frame rate into 3 or more sub-frame periods sub-frame images in a number corresponding to the number of sub-frame periods that are generated in the one frame period, turn on an infrared light source that irradiates infrared light onto an image pickup range in a time length unit that is the equal to at least one of the 3 or more sub-frame periods in the one frame period, and generate a color image at the predetermined frame rate based on an infrared image which is based on a fit sub-frame image of the sub-frame images in which the infrared light is irradiated during a first exposure time of the first sub-frame image and a visible image which is based on a second sub-frame image of the sub-frame images in which the infrared light is not irradiated in a second exposure time of the second sub-frame image, wherein the processing circuitry is configured to convert luminance information of the infrared image and color difference information of the visible image into color information of the color image based on luminance information of the visible image.

16. The image pickup apparatus according to claim 3, wherein the infrared light source is turned on for one of the pair of the sub-frame images.

* * * * *